(12) United States Patent
Variyam et al.

(10) Patent No.: US 11,940,480 B2
(45) Date of Patent: Mar. 26, 2024

(54) FUNCTIONAL TEST HEAD FOR PRINTED CIRCUIT BOARDS

(71) Applicant: Anora, LLC, Richardson, TX (US)

(72) Inventors: Pramodchandran Variyam, Plano, TX (US); Avinash Virupakshaiah Pura, Allen, TX (US)

(73) Assignee: Anora, LLC, Richardson, TX (US)

( * ) Notice: Subject to any disclaimer, the term of this patent is extended or adjusted under 35 U.S.C. 154(b) by 0 days.

(21) Appl. No.: 17/966,535

(22) Filed: Oct. 14, 2022

(65) Prior Publication Data

US 2023/0120501 A1 Apr. 20, 2023

Related U.S. Application Data

(60) Provisional application No. 63/270,040, filed on Oct. 20, 2021.

(51) Int. Cl.
*G01R 31/28* (2006.01)

(52) U.S. Cl.
CPC ..... *G01R 31/2803* (2013.01); *G01R 31/2808* (2013.01)

(58) Field of Classification Search
CPC ...... G01R 31/20; G01R 31/043; G01R 31/28; G01R 31/2801; G01R 31/2803; G01R 31/2805; G01R 31/22806; G01R 31/2808; G01R 31/2818; G01R 31/281; G01R 31/2812; G01R 31/2889; G01R 31/23181; G01R 31/318505; G01R 31/318508; G01R 31/07328; G01R 1/02; G01R 1/04; G01R 1/06; G01R 1/067; G01R 1/0433; G01R 1/0466; G01R 1/0483; G01R 1/06722; G01R 1/07378; G01R 1/07328;
(Continued)

(56) References Cited

U.S. PATENT DOCUMENTS 5,227,717 A * 7/1993 Tsurishima ............. G01R 1/04
324/756.05
6,084,422 A * 7/2000 Bartholomew .... G01R 31/2808
324/756.07
(Continued)

OTHER PUBLICATIONS

EMC Technologies, "Test Systems and Integration," copyright 2021, retrieved from https://emctechinc.com/test-systems-and-integration/ (3 pages).
(Continued)

*Primary Examiner* — Thang X Le
(74) *Attorney, Agent, or Firm* — Alliance IP, LLC

(57) ABSTRACT

An apparatus includes a test head frame and a tray slidably coupled to the frame and configured to receive a printed circuit board (PCB) to be tested. The PCB is positioned within the frame when the tray is in a retracted position and outside the frame when the tray is in an ejected position. A bed of nails (BON) opposes a lower side of the PCB and includes a plurality of pins having first portions arranged on an upper side of the BON to connect with corresponding electrical pads on the lower side of the PCB when the tray containing the PCB is in the retracted position. A plurality of interface printed circuit boards is configured for connection to second portions of the plurality of pins exposed on a lower side of the BON and for receiving test signals when the tray containing the PCB is in the retracted position.

20 Claims, 34 Drawing Sheets

(58) Field of Classification Search
CPC ...... G01R 31/318538; G01R 31/31905; G01R 31/3167; G01R 31/2844; G01R 31/2874; G01R 31/2806
See application file for complete search history.

(56) References Cited

U.S. PATENT DOCUMENTS

| | | | | |
|---|---|---|---|---|
| 7,535,214 | B2* | 5/2009 | Hopkins | G11C 29/56 324/757.04 |
| 2008/0191725 | A1* | 8/2008 | Cojocneanu | G01R 31/2887 324/754.13 |
| 2011/0074080 | A1* | 3/2011 | Di Stefano | H01L 21/67333 29/559 |
| 2011/0074458 | A1* | 3/2011 | Di Stefano | G01R 31/2863 324/757.01 |

OTHER PUBLICATIONS

Ratna, "Test Equipment—Importance, How it Works, Types, Application, Precaution," Feb. 9, 2016, retrieved from https://electricalfundablog.com/importance-of-test-equipment/ (8 pages).
Statement Regarding Prior Disclosures, Nov. 16, 2023 (1 page).

* cited by examiner

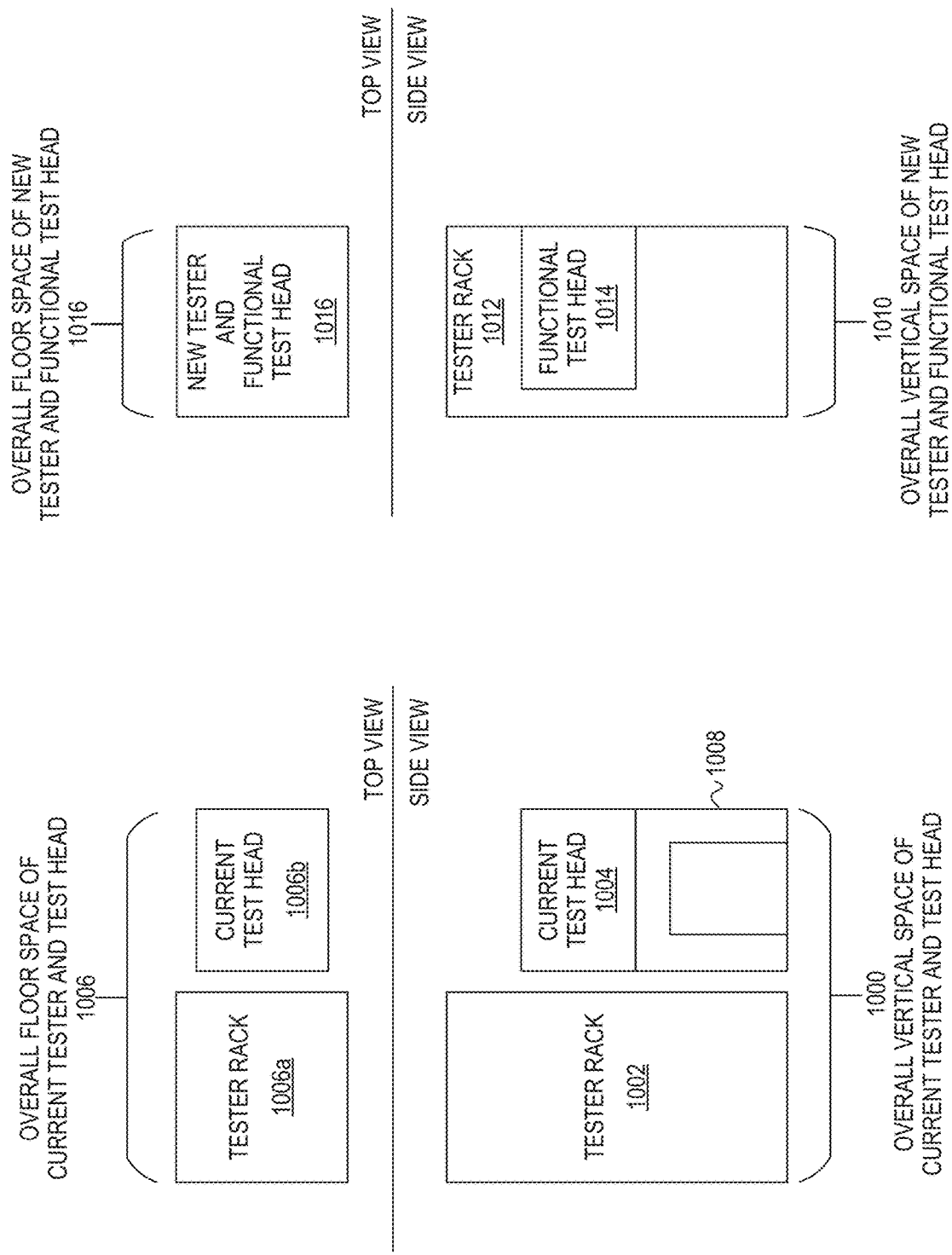

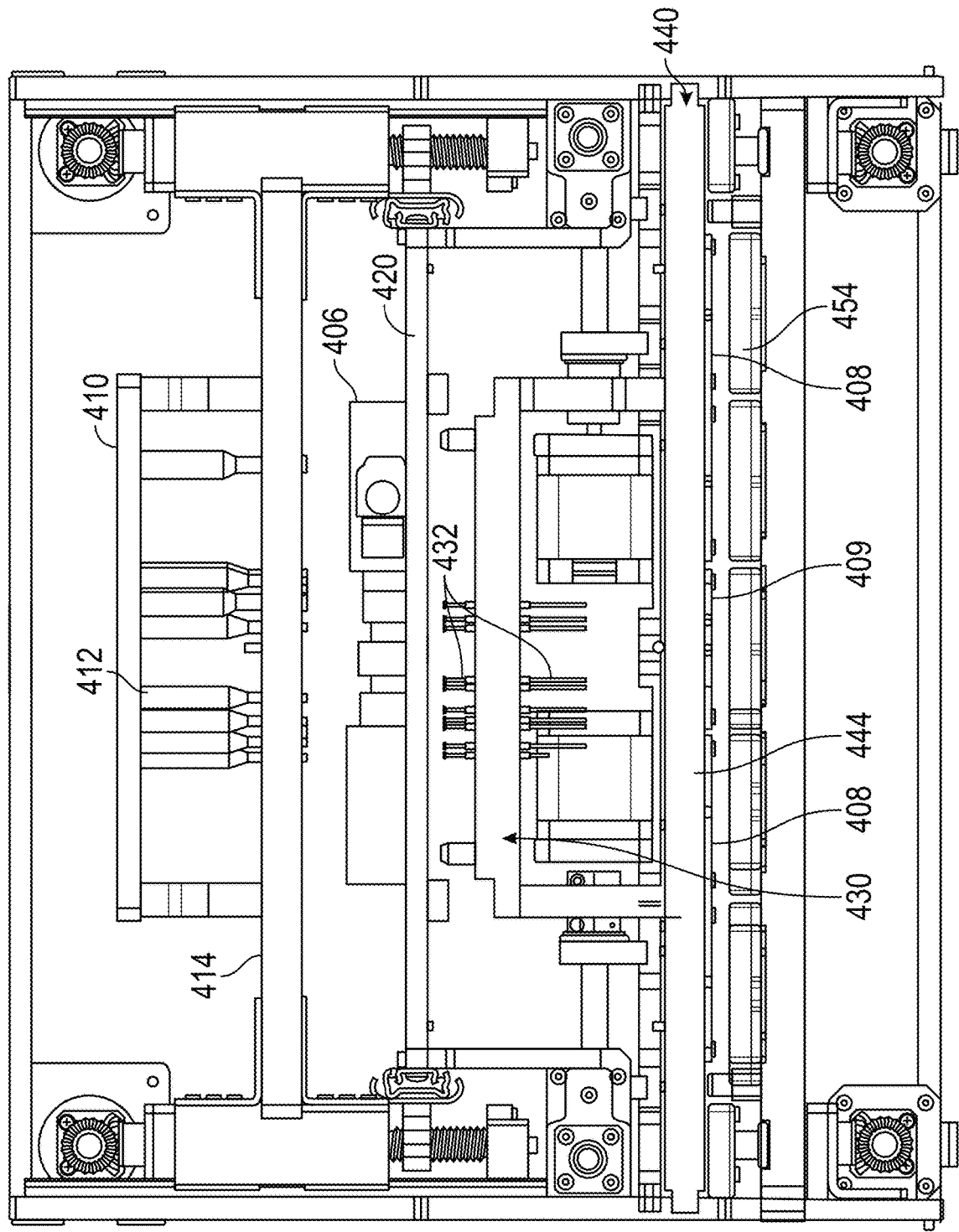

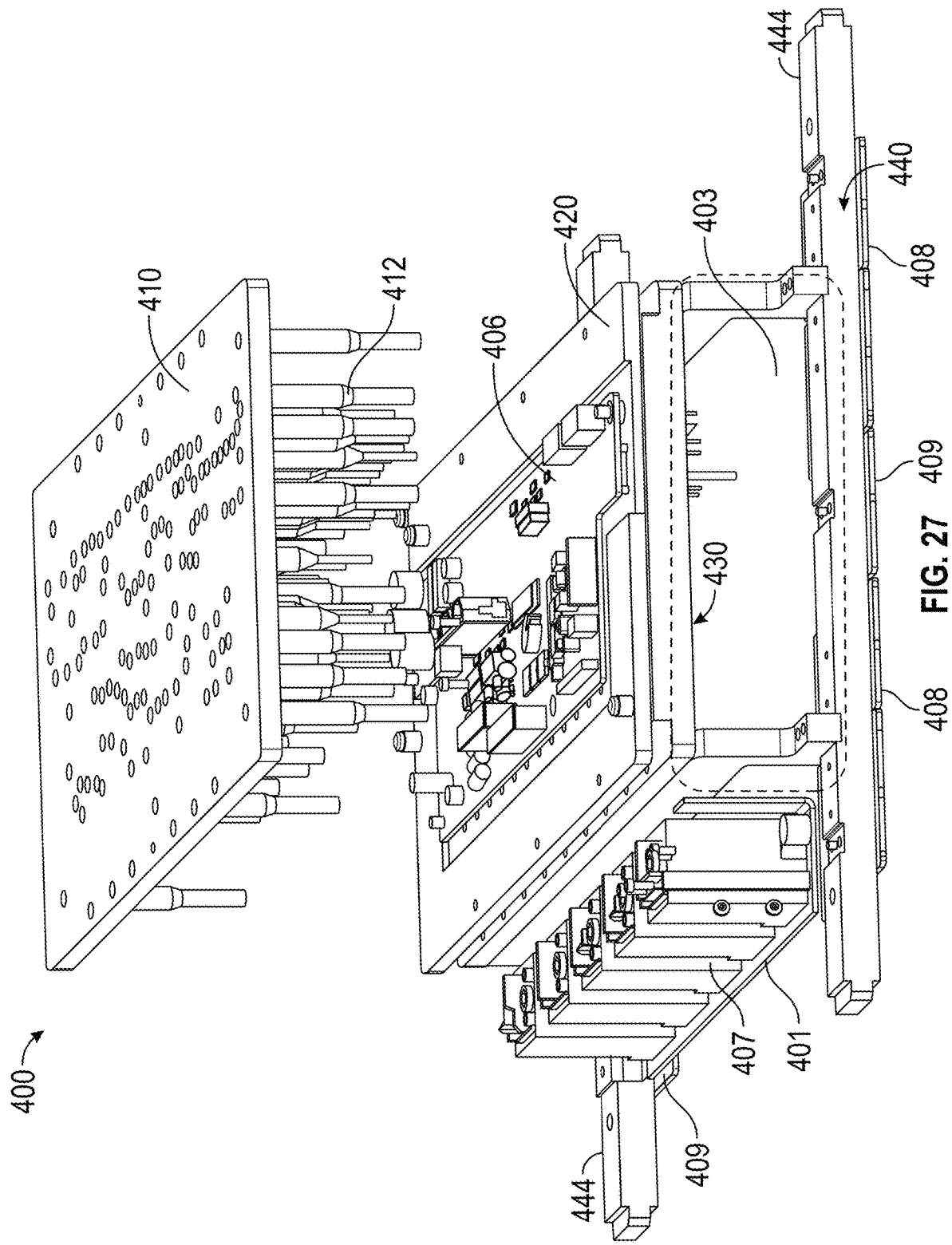

FUNCTIONAL TEST HEAD FOR PRINTED CIRCUIT BOARDS

CROSS REFERENCE TO RELATED APPLICATION

This application claims the benefit of, and priority to, U.S. Provisional Patent Application No. 63/270,040, entitled "FUNCTIONAL TEST HEAD FOR PRINTED CIRCUIT BOARDS", filed Oct. 20, 2021, the entire disclosure of which is incorporated herein by reference.

TECHNICAL FIELD

The present disclosure relates in general to the field of electronic product manufacturing, and more specifically, to an improved functional test head for printed circuit boards and functional testing of printed circuit boards.

BACKGROUND

Typical steps of electronic product manufacturing include fabrication and assembly, functional testing, product assembly, and product functional testing. An electronic product typically contains several printed circuit boards (PCB). These PCBs are fabricated, assembled, and tested to ensure that they function correctly. Then they are assembled into the final product's enclosure or casing. After the product is assembled, the product assembly goes through another round of testing to ensure that the product is assembled correctly. These steps of verifying the functionality of the PCB and the final product assembly are known as functional testing.

BRIEF DESCRIPTION OF THE DRAWINGS

FIGS. 10A and 10B are block diagrams illustrating spacing arrangements in factory floors using existing test heads versus using function test heads according to an embodiment;

FIGS. 26A and 26B are conceptual diagrams of an improved functional test head illustrating how the electrical connection between a DUT and a bed of nails is established according to an embodiment;

FIG. 27 is an exploded perspective view of a change kit with a DUT of an improved functional test head according to an embodiment;

DETAILED DESCRIPTION

The present disclosure provides various possible embodiments, or examples, of apparatuses, architectures, and methods for an improved functional test head to facilitate functional testing of assembled printed circuit boards. The improved functional test head disclosed herein offers a solution to crowded and tight testing conditions that are typical in contract manufacturing test floors that house 19-inch instrument racks. The improved functional test head provides a test frame that fits within an instrument rack and is configured with a suitable structure and components to enable a device under test (DUT) to be slidably moved inward into the test head frame within the rack, from an ejected position to a retracted position. Once in the retracted position, the configuration of the functional test head enables electrical stimuli to be applied to the DUT for testing. This facilitates testing of the DUT in a desired location within a the rack without requiring other structures (e.g., stand, cabinets, carts, devices, etc.) to hold the DUT outside of the rack. Additionally, embodiments described herein enable the DUT type to be easily changed to another DUT type with different electronic components and/or different placements of the electronic components on the PCB. DUT type-specific interfaces can be easily replaced in one or more embodiments to enable electrical signals to be applied to the appropriate electronic components on the new design.

Definitions of various terms are provided to facilitate understanding of the description. The definitions are not intended to be exclusionary, but rather, are intended to be nonlimiting and provided by way of example.

Functional testing—the testing of at least one circuit board, which may be a printed circuit board (PCB) to verify the functionality of the PCB and the final product assembly.

Device under test (DUT)—The printed circuit board under test

Unit under test (UUT)—This may be used interchangeably with DUT

Figure 1:
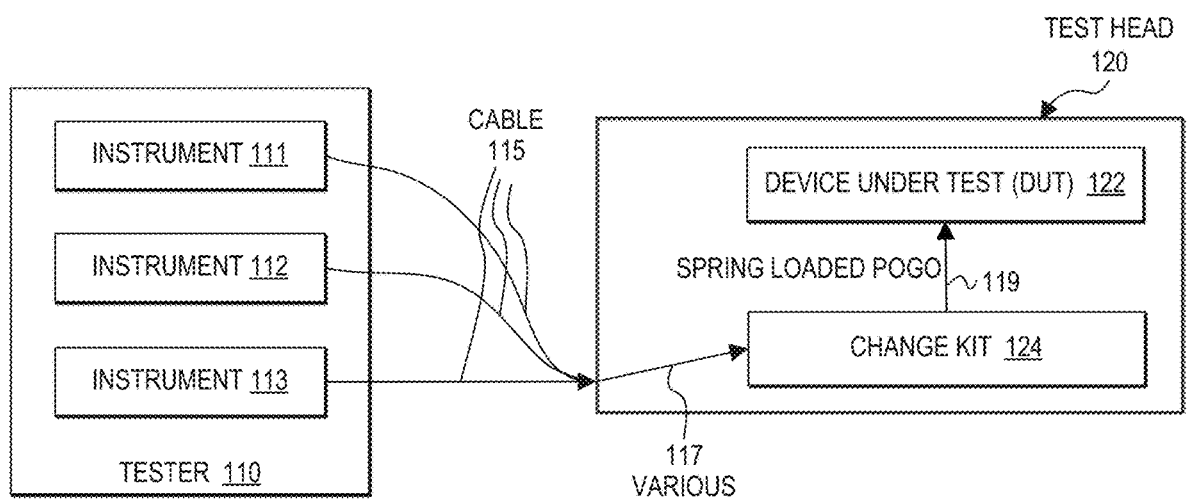
FIG. 1 is a block diagram illustrating example electrical signal flow during functional testing of a device under test (DUT)

Printed Circuit Board (PCB)—Printed circuit board that mechanically supports and electrically connects electronic components needed to make the board function as required FIG. 1 is a block diagram illustrating example components and signal flow of a device under test (DUT) during functional testing. During functional testing of a printed circuit board (PCB), test stimuli are applied to the DUT and responses are measured and compared against set limits to ensure that the DUT performance is satisfactory. Electrical signals to excite the DUT and the DUT response travels between instruments in tester 110 and the DUT via an electrical signal path. This signal path can be divided into three sections: (1) from the tester instruments to a test head, (2) within the test head to a change kit, and (3) from the change kit to the DUT.

FIG. 1 shows the signal path and different components involved in functional testing that is commonly performed. The components include a tester 110 with multiple instruments 111, 112, and 113, a test head 120 to facilitate testing, and a device under test (DUT) 122. Generally, all instruments are located inside the tester 110 (e.g., Instrument 1, Instrument 2, and Instrument 3). The DUT 122 is placed inside the functional test head 120 during functional testing. This test head 120 is referred to herein as "functional test head." This functional test head has two parts: (1) a first portion that does not change from one type of DUT to another (2) a second portion that changes if a different type of PCB or DUT is tested. Accordingly, the second portion may be customized or changed for the specific type of DUT. The second portion is referred to herein as "change kit" as shown at 124.

Electrical connection between the tester instruments 111, 112, and 113 and the DUT 122 may be established thru the following three segments composing the signal path: a cabled connection 115 between tester 110 and the functional test head 120, various connectors 117 (i.e., a cabled connector or a spring-loaded pogo pins based connection) between functional test head 120 and change kit 124, and a spring-loaded pogo pin based connection between change kit 124 and DUT 122.

The choice of technology used in the three segments of electrical connection can have a direct impact on the performance of the test set-up. The instruments in the automatic test equipment (ATE) are typically changed infrequently and often electrical connection is fixed for a given test set-up. So, connection between the instruments 111, 112, and 113 and the test head 120 can be thru electrical cables and connectors.

To test a new type of DUT, connection between the test head 120 and change kit 124 may need to be changed. Thus, the connection between the test head 120 and change kit 124 may change more frequently. A typical electrical connector can only go through a limited number of connect-disconnect cycles before the connector starts wearing out. Therefore, it is desirable to employ pogo pins to facilitate this connection. During production, a DUT changes very frequently. Hence, pogo pin-based contacting technology is used for connection between change kit 124 and DUT 122 for best accuracy. Pogo pin based connections are often rated for one million insertions or more.

Embodiments of a functional test head presented herein can overcome many challenges with existing functional test heads. One or more embodiments of a functional test head, as disclosed herein, improve production throughput, reduce test cost, reduce equipment down time, reduce change over time, and improve production efficiency.

Figure 2:
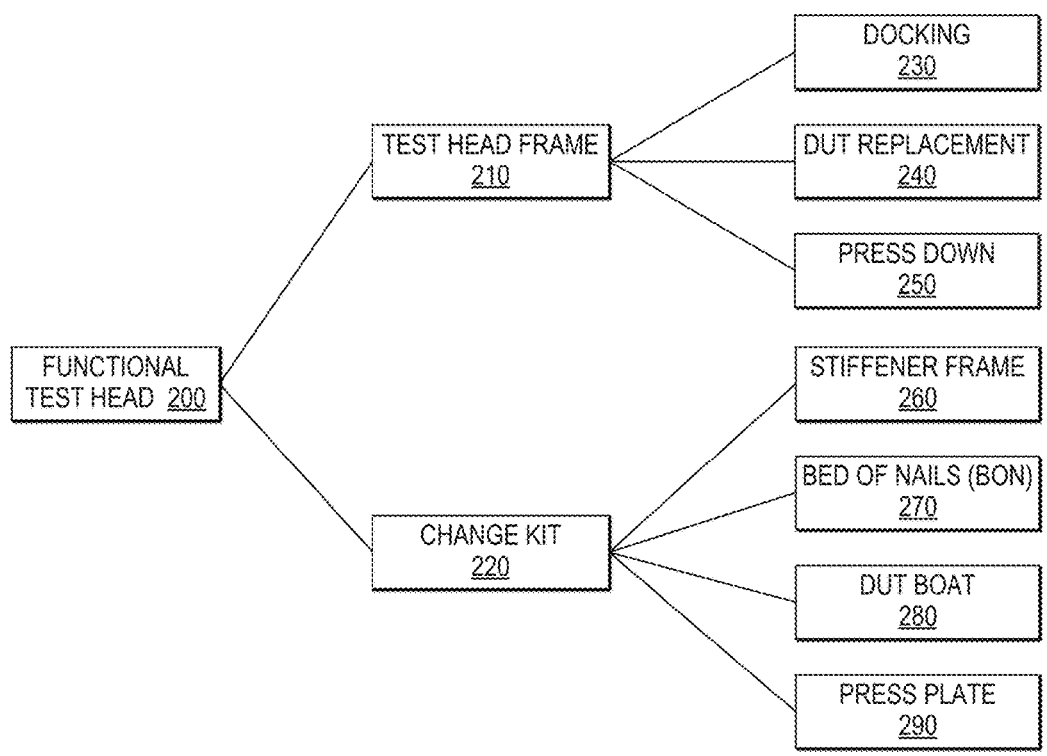
FIG. 2 is a hierarchical block diagram identifying general components of one or more embodiments of an improved functional test head as disclosed herein.

FIG. 2 is a block diagram identifying general components of one or more embodiments of an improved functional test head 200 as disclosed herein. Improved functional test head 200 may contain two distinct parts. A first part of improved functional test head 200 is a test head frame 210, which is DUT type-independent. A second part is a DUT type-dependent change kit 220. In one or more embodiments, the DUT type-independent test head frame 210 contains automation and mechanisms for the following unique features:

A docking mechanism 230 to establish electrical connection between test head frame 210 and change kit 220;

A retractable tray for easy replacement 240 of DUT; and

A press down mechanism 250 to make electrical connection between change kit 220 and the DUT.

The DUT type-dependent change kit 220 may contain the following components:

A stiffener frame 260 to electrically interface the change kit 220 with the test head frame 210;

A bed-of-nails (BON) 270 to house pogo pins that touch down on the DUT electrical pads;

A DUT boat 280 (e.g., carrier plate) to place and align the DUT to the BON; and A press plate 290 to press down on the DUT and make electrical contact between the BON and the DUT.

Figure 3A:
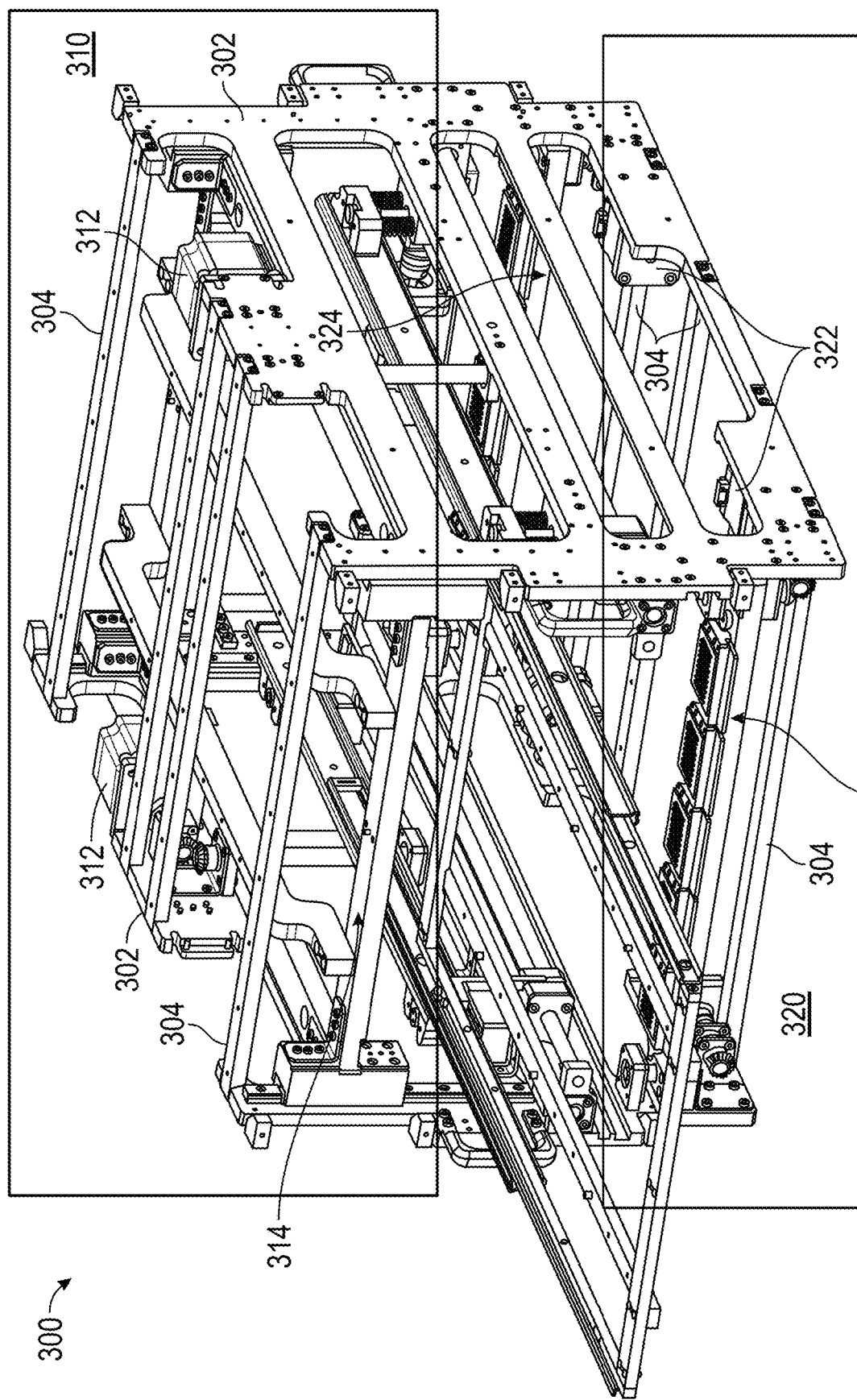
FIGS. 3A and 3B are front, top, and right side perspective views of a test head frame of an improved functional test head according to an embodiment.

Turning to FIG. 3A, FIG. 3A is a front, top, and right side perspective view of a test head frame 300 according to an embodiment. Test head frame 300 is one example of test head frame 210 of improved functional test head 200. The test head frame 300 includes an outer frame structure including two generally parallel lateral walls 302 and multiple support beams 304 connecting the lateral walls 302. The test head frame 300 further includes a press down mechanism 310 located generally at the top side of the test head frame 300 and delineated generally by an upper black box. The press down mechanism 310 includes two press down motors 312 and a press down frame 314. The test head frame 300 also includes a docking mechanism 320 located generally at the bottom of the test head frame 300 and delineated generally by a lower black box. The docking mechanism 320 includes four docking motors 322, two shown in FIG. 3A on the right side and two others located symmetrically on the left side lateral wall (as shown in other figures herein), and front and rear pogo frames 324.

Figure 3B:
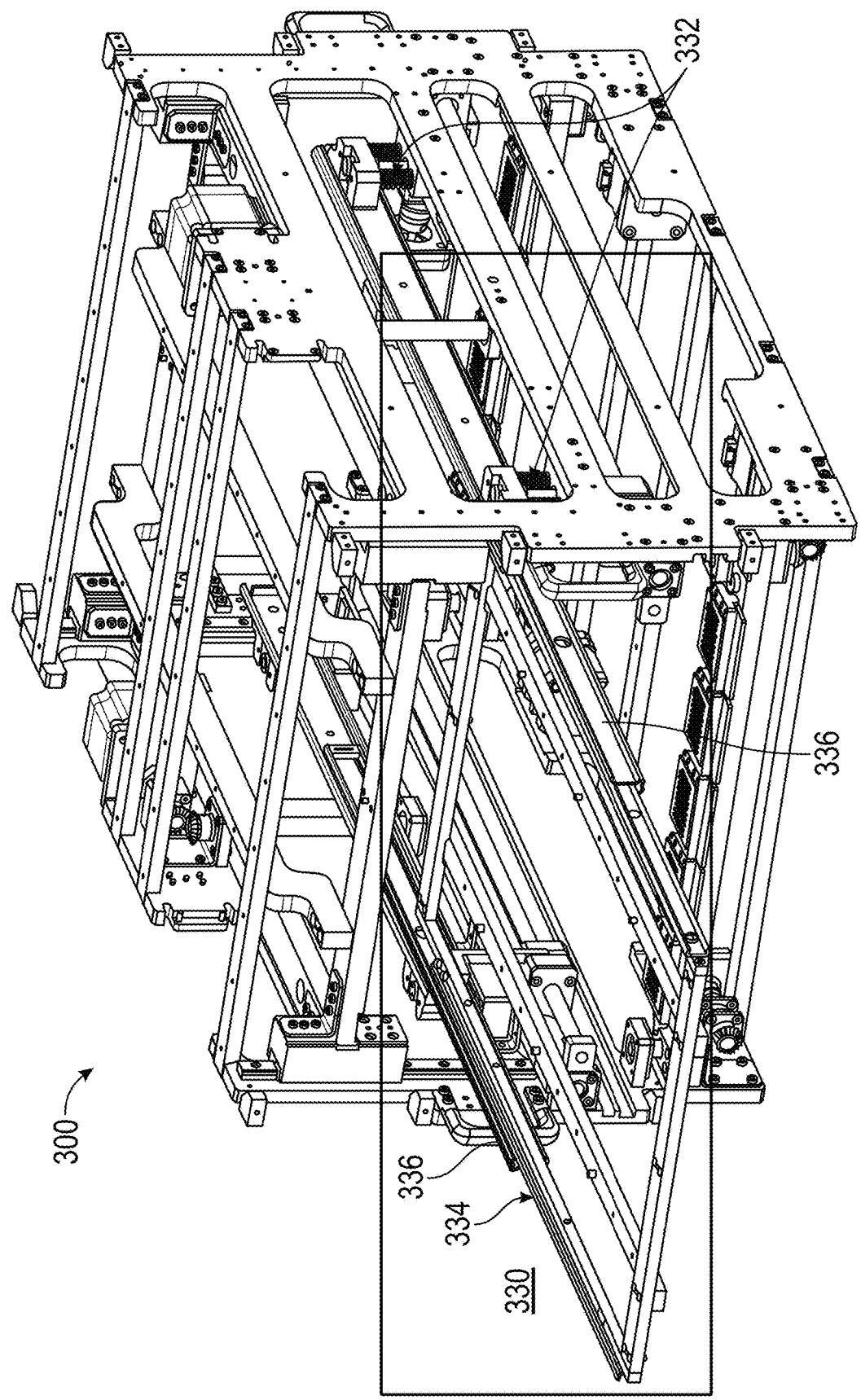

FIG. 3B is also front, top, and right side perspective view of test head frame 300 of improved functional test head 200. The test head frame 300 includes a DUT tray mechanism 330 located generally in the middle of the test head frame 300 and delineated generally by a black box. The DUT tray mechanism 330 includes a tray mount mechanism 332 and a DUT tray 334. The DUT tray 334 is slidably coupled to the test head frame 300 via tray mount mechanism 332 and a pair of telescopic rails 336 such that the tray can slide forward and backward between an ejected position (shown in FIG. 3B) in which the DUT tray 334 is contained within the outer frame of the test head frame 300 and a retracted position (shown in FIGS. 18, 21, 23, and 30 for example) in which the DUT tray 334 is partially exposed outside the outer frame of the test head frame 300.

Figure 4A:
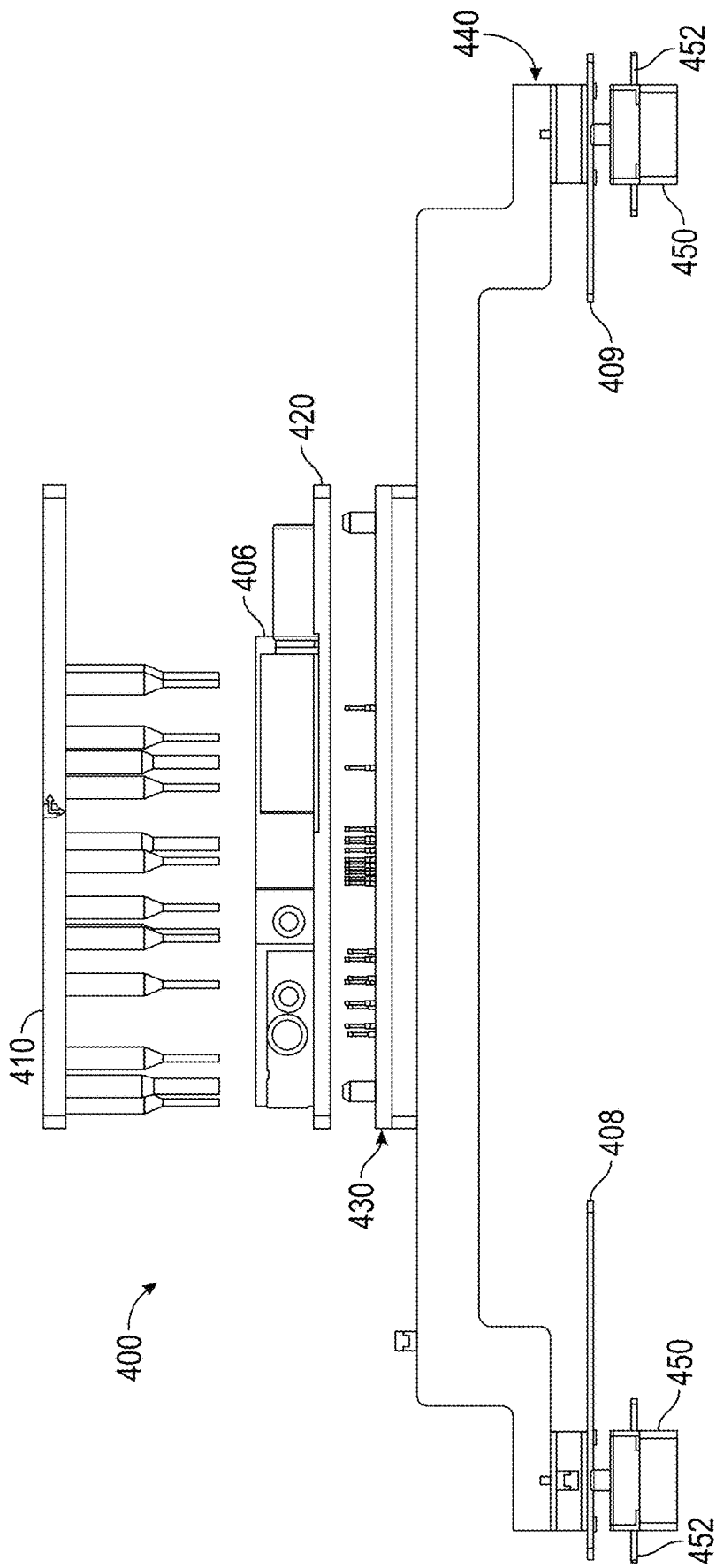
FIGS. 4A-4C are various views of a change kit for an improved functional test head and other selected components according to an embodiment.
Figure 4B:
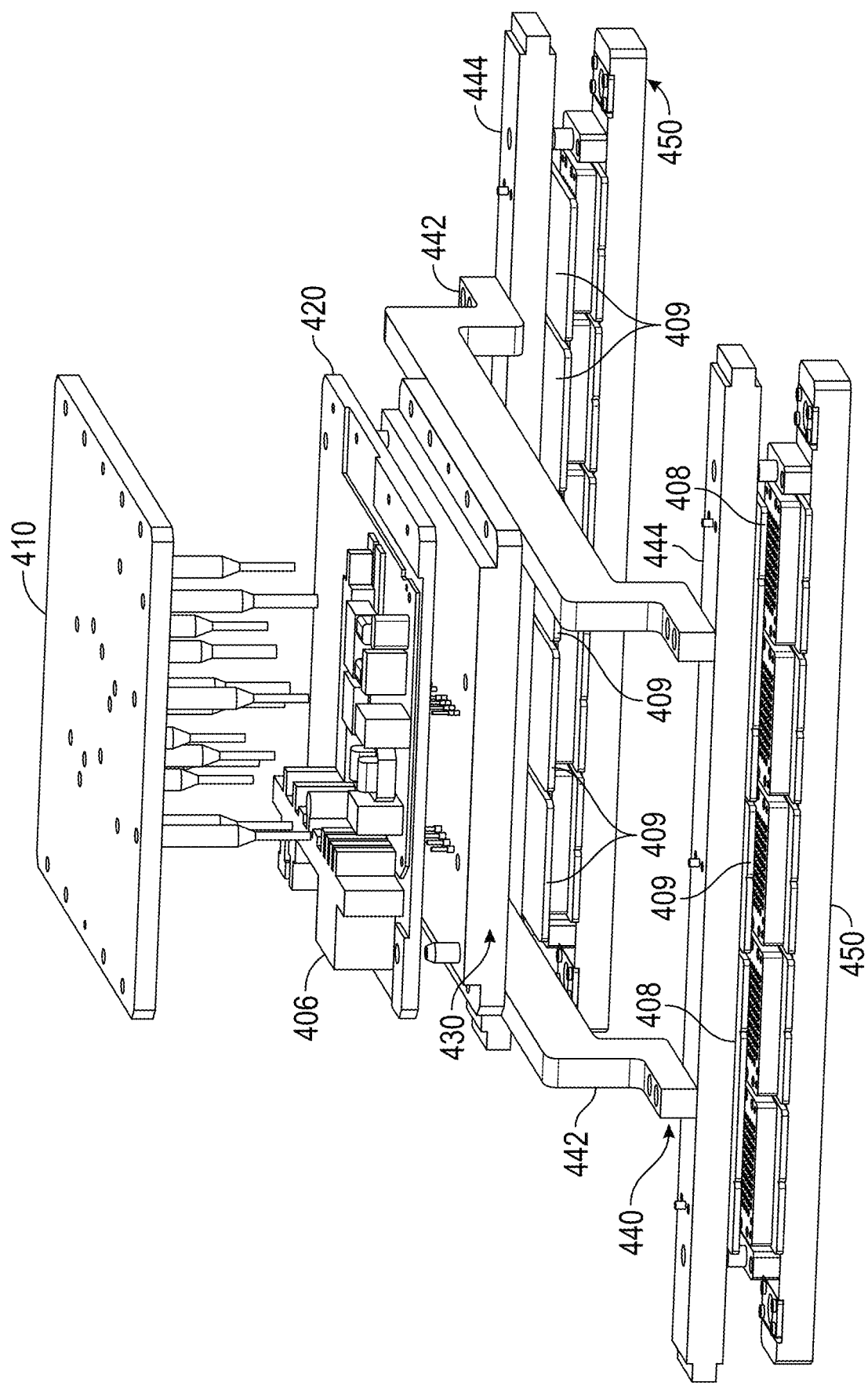
Figure 4C:
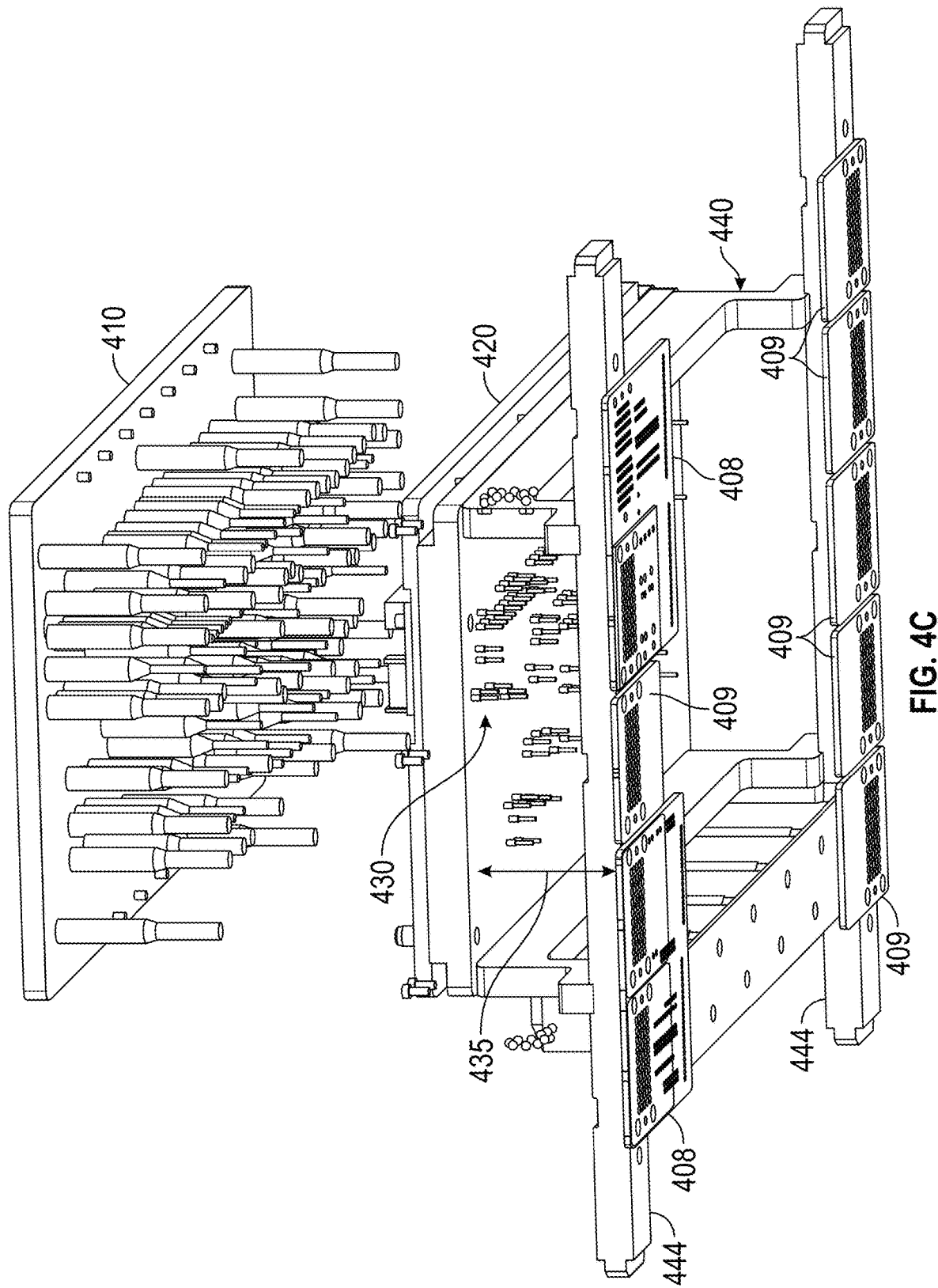

FIGS. 4A, 4B, and 4C are various views of a change kit 400 and an example DUT according to an embodiment. Change kit 400 is one example of change kit 220 of improved functional test head 200. FIG. 4A is a partially exploded side view of change kit 400, along with front and rear pogo frames 450 (e.g., corresponding to pogo frame 324), a pogo PCB 452, a DUT 406, and interface PCBs 408 and 409. In at least one embodiment, change kit 400 includes four subassemblies, including a press plate 410, a DUT boat/carrier plate 420, a bed of nails (BON) 430, and a stiffener frame 440.

FIG. 4B is a partially exploded front, side and top perspective view of change kit 400, along with the pogo frames 450, the DUT 406 seated in carrier plate 420, and the interface PCBs 408 and 409. At least some of the interface PCBs (e.g., 409) can be DUT-specific such that test signals via those interface PCBs are operationally specific to the DUT 406 to be tested in that change kit. The stiffener frame 440 includes two generally parallel stiffener horizontal bars 444 attached to two generally parallel stiffener cross bars 442. As shown in FIG. 4B, each stiffener cross bar 442 includes one end attached to one of the horizontal bars 444 and an opposite end attached to the other horizontal bar 444. FIG. 4C is an exploded bottom, front, and side view of the change kit 400, and the interface PCBs 408 and 409. FIGS. 4B and 4C also show the components of change kit 400, including press plate 410, DUT boat/carrier plate 420, bed of nails (BON) 430, and stiffener frame 440.

Figure 5:
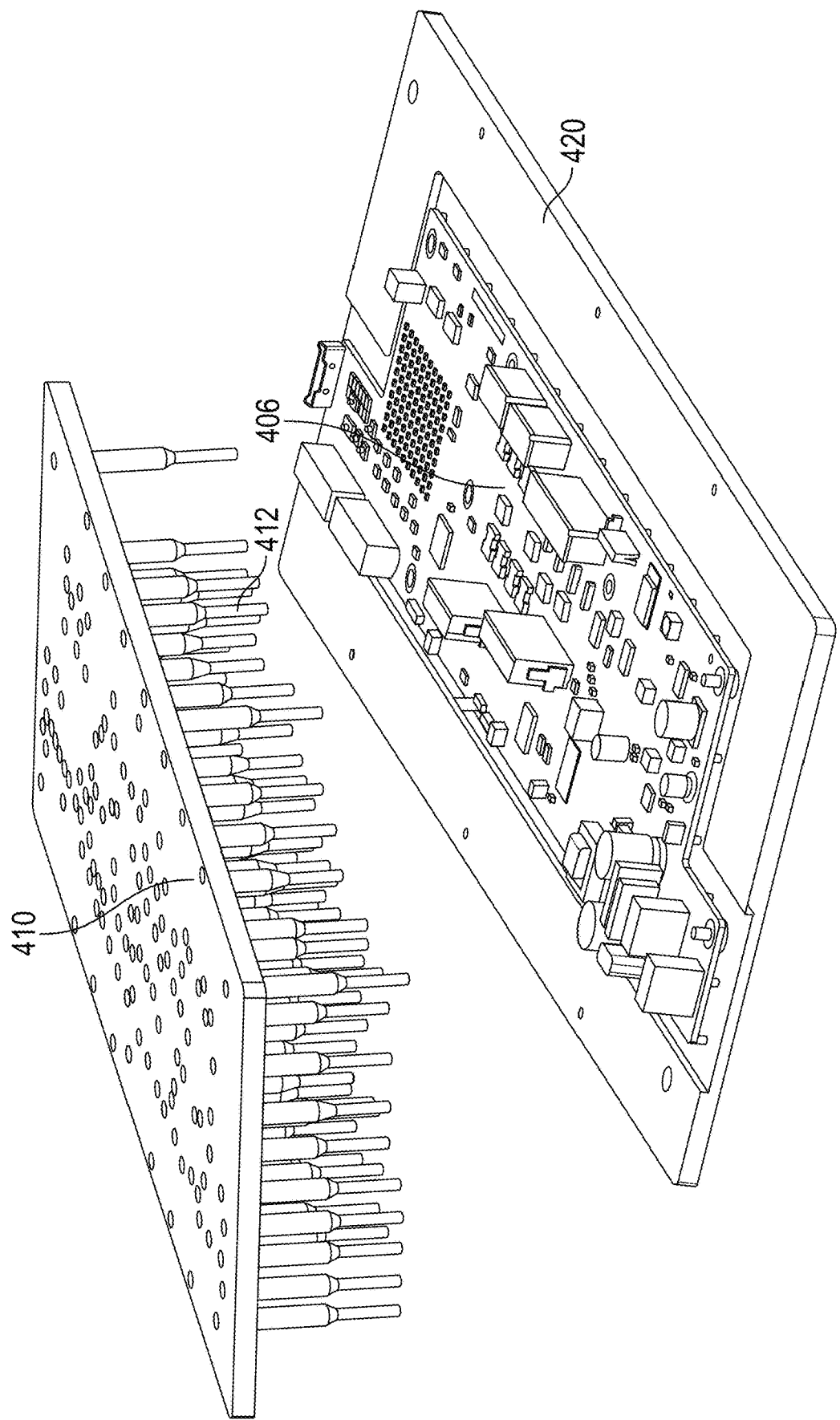
FIG. 5 is an exploded view of a press plate subassembly and a device under test on a boat/carrier plate subassembly of a change kit of an improved functional test head according to an embodiment.

FIG. 5 is an exploded view of the press plate 410 and the DUT 406 on boat/carrier plate 420, according to an embodiment. Press plate 410 is one example of press plate 290 of improved functional test head 200. Press plate can be a dielectric plate which houses several antistatic press pins 412. The press plate 410 can be mounted on the press down mechanism (e.g., press down mechanism 310 of FIG. 3A) of the test head. When the press down mechanism is actuated, the press plate 410 moves down and pushes the boat/carrier plate 420 along with the DUT 406 to make electrical contact with the bed of nails 430.

Figure 6:
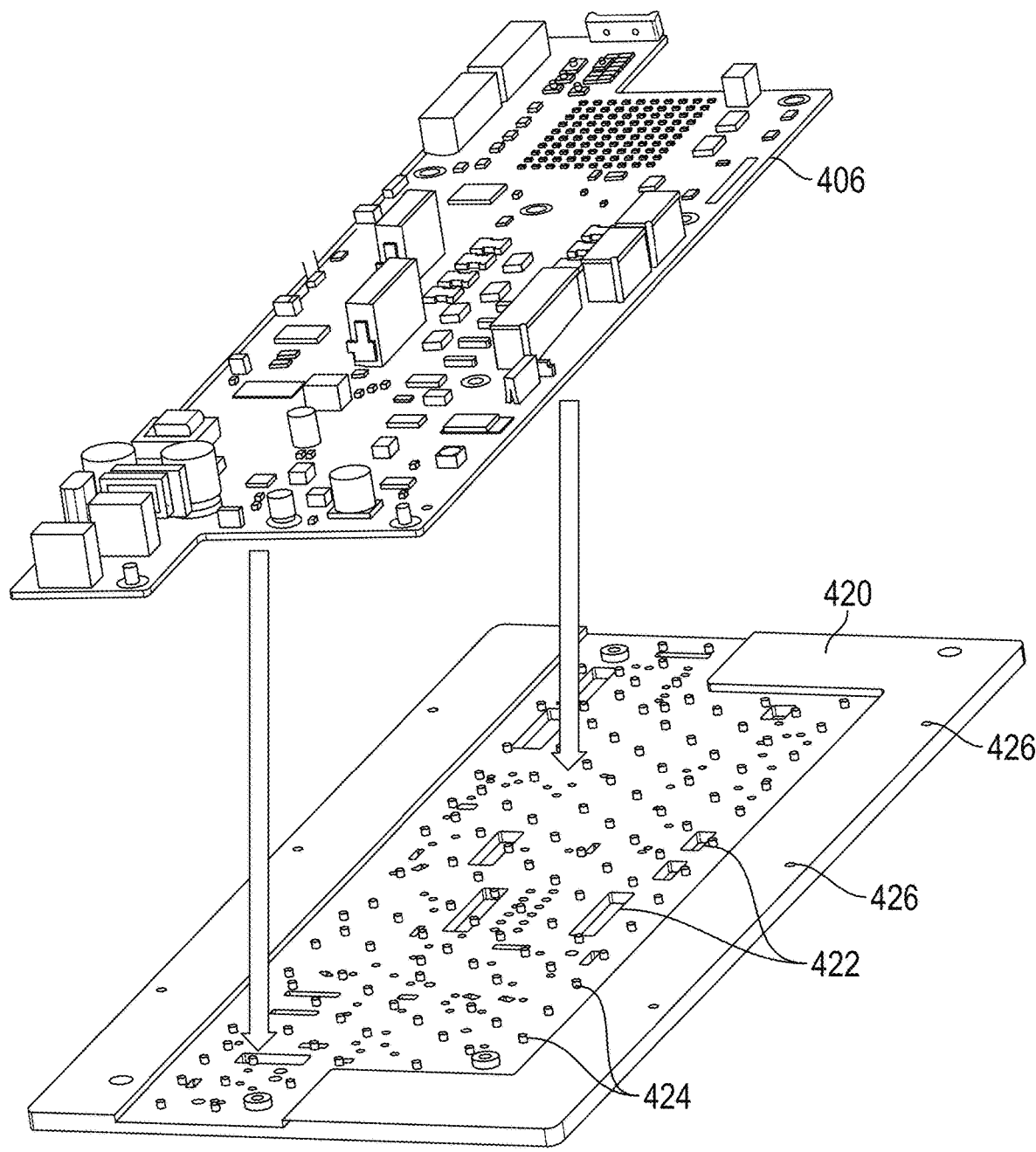
FIG. 6 is an exploded view of a DUT and a boat/carrier plate subassembly of a change kit of an improved functional test head according to an embodiment.

FIG. 6 is an exploded view of the DUT 406 and boat/carrier plate 420 according to an embodiment. Boat/carrier plate 420 is one example of DUT boat 280 of improved functional test head 200. Boat/carrier plate 420 may be custom designed to house the DUT 406. Accordingly, a boat/carrier plate can be sized to accommodate larger or smaller DUTs as allowed by the bed of nails 430 and stiffener frame 440. In some embodiments, the carrier plate could be designed to receive multiple DUTs to be tested concurrently or sequentially. Boat/carrier plate 420 can include clearance holes 422 (e.g., multiple rectangular or others suitably shaped openings) for the bed of nails pins 432 (shown in FIG. 7 and which may be pogo pins in at least some embodiments) to pass through and make contact with electrical pads on the DUT 406. Boat/carrier plate 420 provides alignment features to precisely locate the DUT 406. Boat/carrier plate 420 also has standoffs 424, which keep the DUT 406 parallel to the boat/carrier plate 420 even if there are some components or electrical leads sticking out of the bottom surface. Also, openings 426 are formed along opposite sides of the boat/carrier plate 420.

Figure 7:
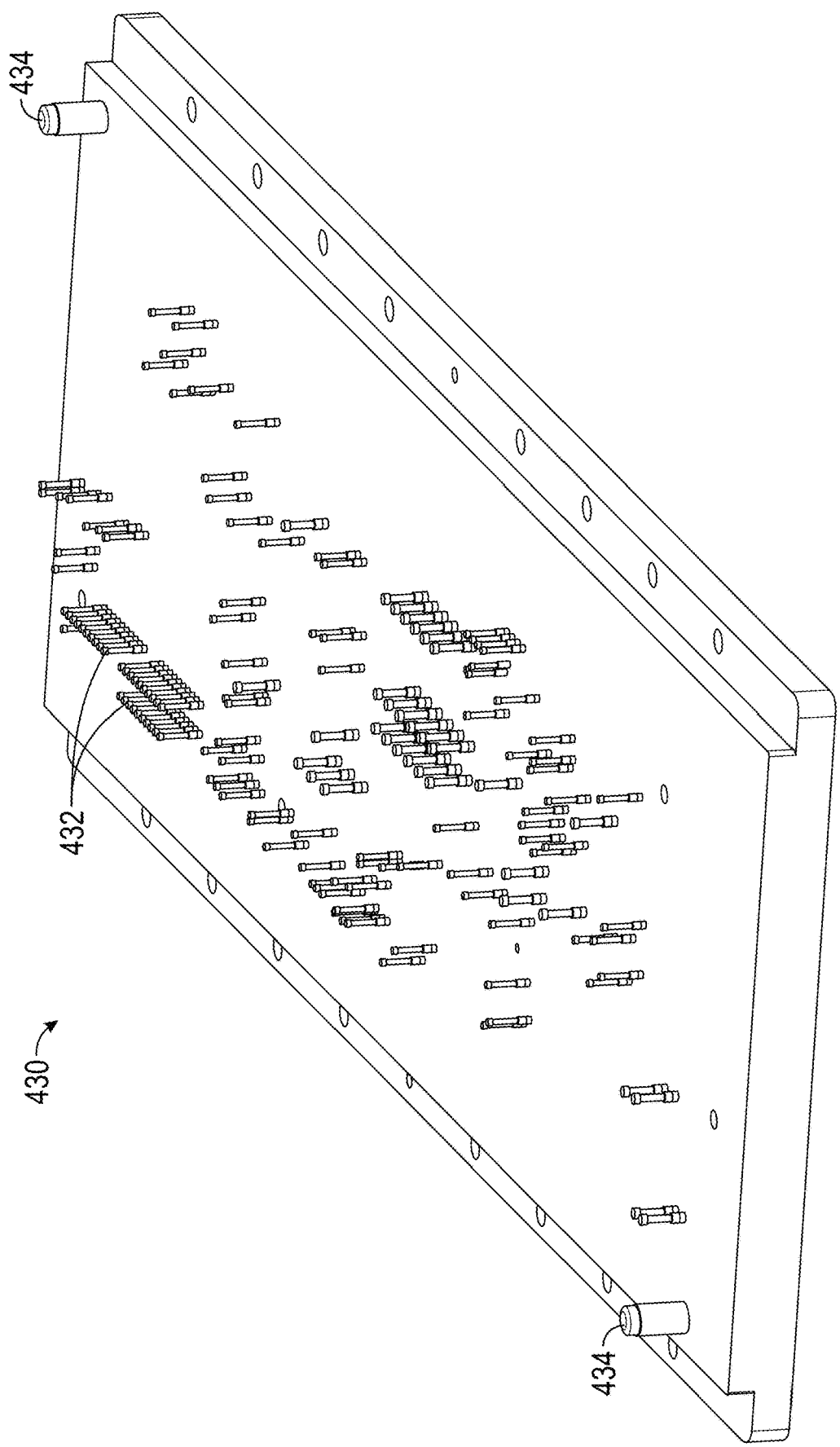
FIG. 7 is a top and side perspective view of the bed of nails subassembly according to an embodiment.

FIG. 7 is a top and side perspective view of the bed of nails 430, according to an embodiment. Bed of nails 430 is one example of bed of nails 270 of improved functional test head 200. Bed of nails 430 may house spring-loaded pogo pins 432 on a dielectric material that makes electrical contact with the DUT upon activating the press down motors. The bed of nails 430 is mounted on the stiffener frame 440 and electrical signals are wire wrapped to the interface PCBs 408 and 409 of the change kit 400, as seen in FIG. 4C. Thus, pins may be present on the interface PCBs in order to accommodate wire wrapping. Any other suitable means of connection (e.g., soldering, etc.) may alternatively be used. Alignment features 434 may be provided to align the BON 430 to the boat/carrier plate 420.

Figure 8:
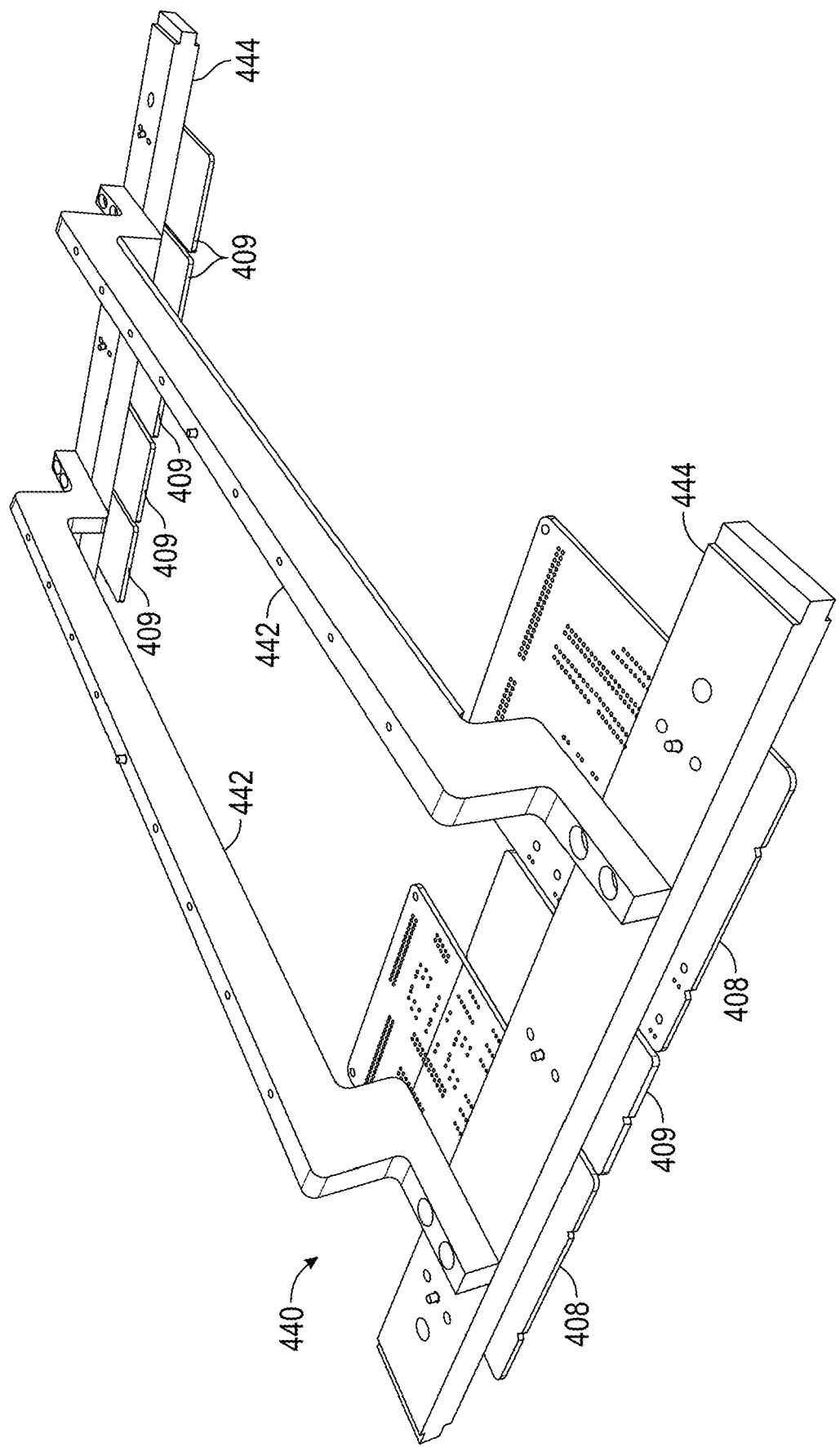
FIG. 8 is a top, front and side perspective view of a stiffener frame subassembly and interface PCBs of a change kit of an improved functional test head according to an embodiment.

FIG. 8 is a top, front, and side perspective view of stiffener frame 440 and interface PCBs 408 and 409, according to an embodiment. Stiffener frame 440 is one example of stiffener frame 260 of improved functional test head 200. Stiffener frame 440 houses the change kit PCB 408, which provides a mechanism to electrically interface with the test head via docking mechanism (e.g., docking mechanism 320 in FIG. 3A). Stiffener frame 440 can include two generally parallel stiffener cross bars 442 attached to two generally parallel stiffener horizontal bars 444. As shown in FIG. 8 each stiffener cross bar 442 includes one end attached to one of the horizontal bars 444 and an opposite end attached to the other horizontal bar 444, such that the crossbar is generally perpendicular to each horizontal bar 444.

Figure 9:
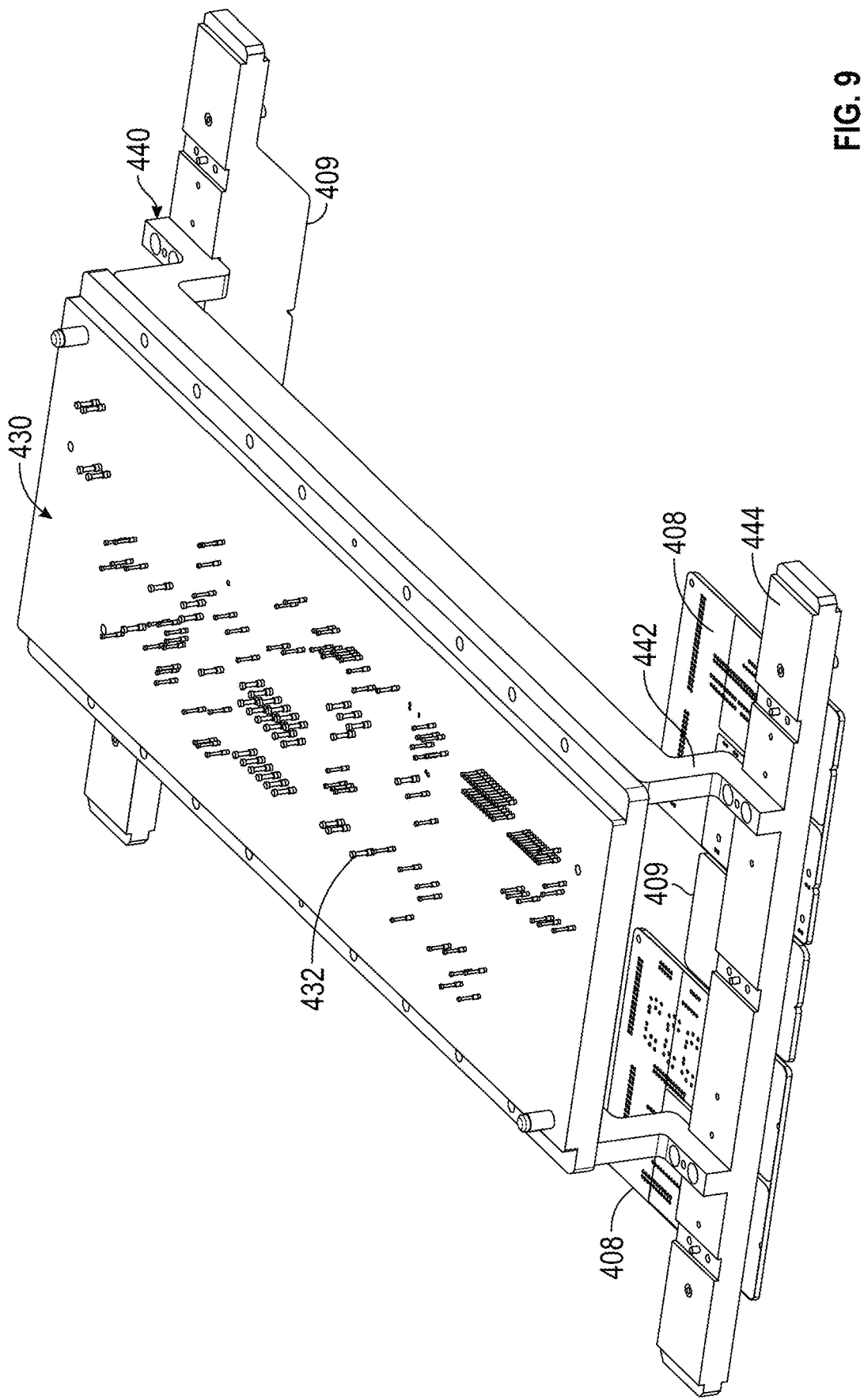
FIG. 9 is a top, front and side perspective view of a stiffener frame subassembly, bed of nails subassembly, and interface PCBs of a change kit of an improved functional test head according to an embodiment.

FIG. 9 is a top, front, and side perspective view of stiffener frame 440, bed of nails 430, and change kit PCBs 408. As shown in FIG. 9, stiffener frame 440 holds the bed of nails 430, which is attached to and extends between stiffener cross bars 442 of the stiffener frame 440. As shown in FIG. 9 (and FIG. 4C at 435), stiffener frame 440 provides enough clearance between the change kit PCBs 408 and 409 to the bed of nails 430 for wiring electrical signals therebetween.

FIGS. 10A and 10B are block diagrams illustrating spacing arrangements in factory (e.g., contract manufacturers test floor or any other facility that houses instrument racks)

floors using current test heads (FIG. 10A) versus using embodiments of improved functional test head 200 disclosed herein (FIG. 10B). FIG. 10A illustrates a tester rack 1002, a current test head 1004, and the floor space 1006a consumed by the tester rack 1002 and floor space 1006b consumed by the current test head 1004. FIG. 10B illustrates a tester rack 1012, an improved functional test head 1014 according to embodiments disclosed herein, and the floor space 1016 consumed by the tester rack 1012 and the improved functional test head 1014 disclosed herein. Improved functional test head 1014 represents an example of improved functional test head 200.

Functional testers typically use standard 19" instrument racks to house all the tester instruments. The test head of these typical testers are housed outside on a stand 1008 next to the tester rack 1002. This arrangement consumes valuable factory floor space. In addition, shipping and installation of these test systems can be more difficult. Advantageously, the improved functional test head 1014 can be assembled inside the 19" tester rack 1012 saving valuable floor space and making shipping and installation simpler.

Generally, two design constraints limit the size of a DUT that can be tested using a specific test head. First, the size of the test head limits the size of the DUT that can be put inside and tested. Second, alignment techniques are often inadequate. Spring loaded pogo pins need to touch down accurately on the test pads on the DUT. Often, a DUT will be designed with very small test pad sizes. The alignment techniques employed by the test head to align the DUT with the change kit is critical to facilitate successful touch down on the test pads. Existing test heads (e.g., 1004) using the conventional techniques are limited in the size of the DUTs that can be tested.

One or more embodiments of improved functional test head 200 enables testing large printed circuit boards to be tested. The functional test head embodiments optimize the space available for the DUTs. Additionally, the functional test head embodiments also employ an efficient method to align the DUT to the change kit. With these techniques, an improved functional test head, as disclosed herein, can test DUTs at least up to a size of 500 mm×300 mm, and potentially larger. Moreover, this improved functional test head does not limit the number of DUTs that can be tested in one insertion. With a large available DUT area, multiple DUTs can be tested at once if the DUT sizes are smaller, as shown in FIG. 11.

Figure 11C:
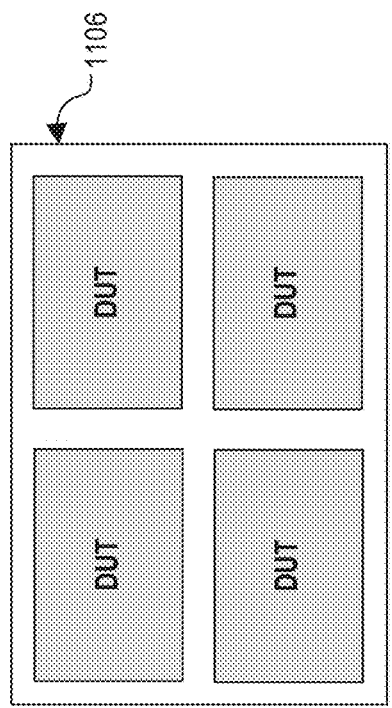
FIGS. 11A-11D are block diagrams illustrating four possible arrangements for DUTs of various sizes to be tested using an improved functional test head according to an embodiment.
Figure 11D:
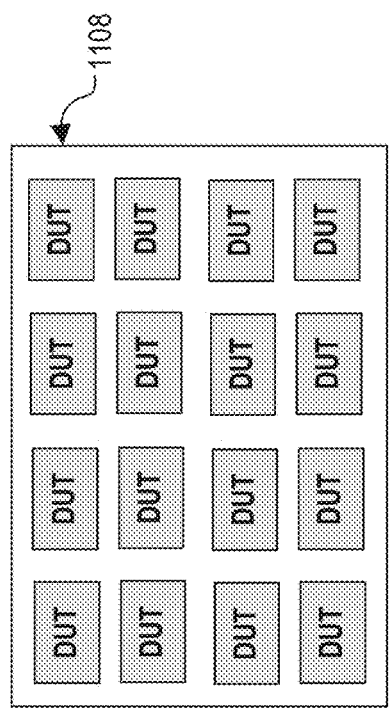
Figure 11A:
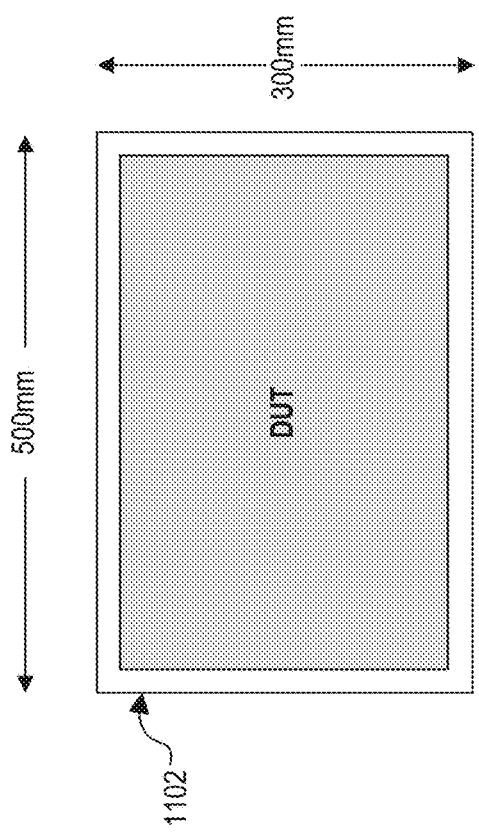
Figure 11B:
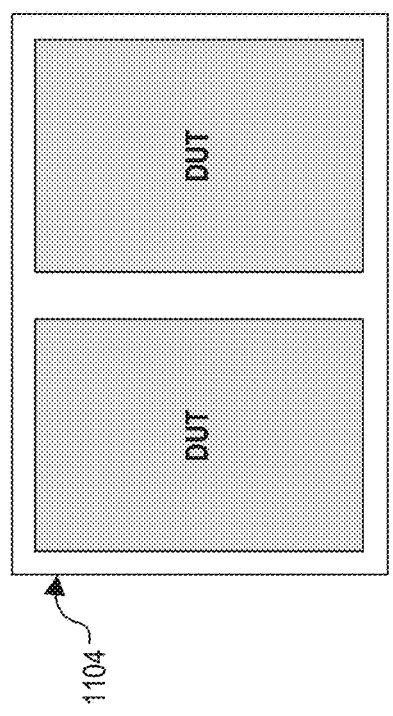

FIGS. 11A-11D are a block diagrams illustrating four possible arrangements for testing DUTs of various sizes using an improved functional test head according to an embodiment. FIG. 11A shows a DUT test area 1102 that holds a single large DUT, FIG. 11B shows a DUT test area 1104 that holds two smaller DUTs, FIG. 11C shows a DUT test area 1106 that holds four even smaller DUTs, and FIG. 11D shows a DUT test area 1108 that holds sixteen yet even smaller DUTs. Thus, numerous configurations can enable flexibility in testing various sizes of DUTs.

In at least one embodiment, improved functional test head 200 can have several actuation and motion mechanisms. Functions of these mechanisms include (1) Docking the test head signals with the change kit, and (2) Pressing down the DUT on to the change kit to make electrical contact. Conventional test heads use air pressure with pneumatic systems to generate force necessary to accomplish these functions. In contrast, improved functional test head 200 accomplishes all these functions using general purpose AC electrical inlets. Further, the mechanisms and electronics inside the improved functional test head 200 can be compatible with common AC supply voltages and frequencies found around the globe.

Full electrical automation of improved functional test head 200 offers several advantages. A fully electrical test head can be simply plugged into the wall AC supply and operated, simplifying factory installations. In addition, functional test solutions typically include both hardware and software. These hardware and software need to be developed and debugged in an engineering environment. Pressurized air required to run pneumatic systems are typically only available in a factory or in a laboratory, and not next to engineering desk. AC electrical plug outlets, however, are commonly available throughout most buildings. Accordingly, embodiments of the improved functional test head 200 disclosed herein can be installed easily in an engineering environment making it easy to develop, debug, and generate a new test solution.

The interface between tester instruments and the test head is modular. These interfaces are also standardized, making additions and changes to the instruments very easy. All electrical interfacing between a tester and test head is done thru a pogo frame. There are two pogo frames (e.g., front and rear pogo frames 450) in the test head.

Figure 12:
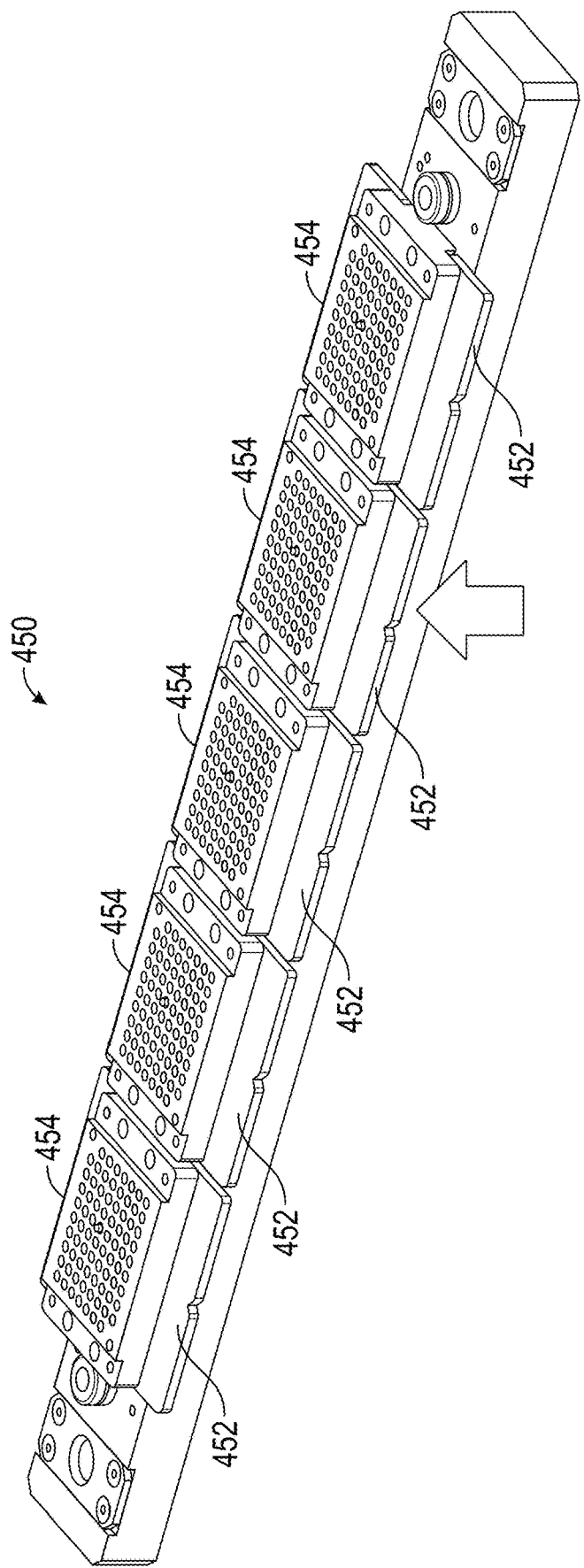
FIG. 12 is a top, front, and side perspective view of a pogo frame of an improved functional test head according to an embodiment.

FIG. 12 is a top, front, and side perspective view of one pogo frame 450 according to an embodiment. Pogo frame 450 is one example of a pogo frame 324 within docking mechanism 320. Each pogo frame 450 can accommodate several pogo blocks 454. Pogo blocks 454 house spring-loaded pogo pins 456 (shown in FIG. 13) inside them. Under the pogo block 454 a pogo PCB 452 is screwed and attached. Tester instruments are connected to the test head through this pogo PCB 452. The pogo pins 456 inside the pogo block 454 touch down on electrical pads on the pogo PCB 452 and conduct the electrical signals to the change kit.

Figure 13:
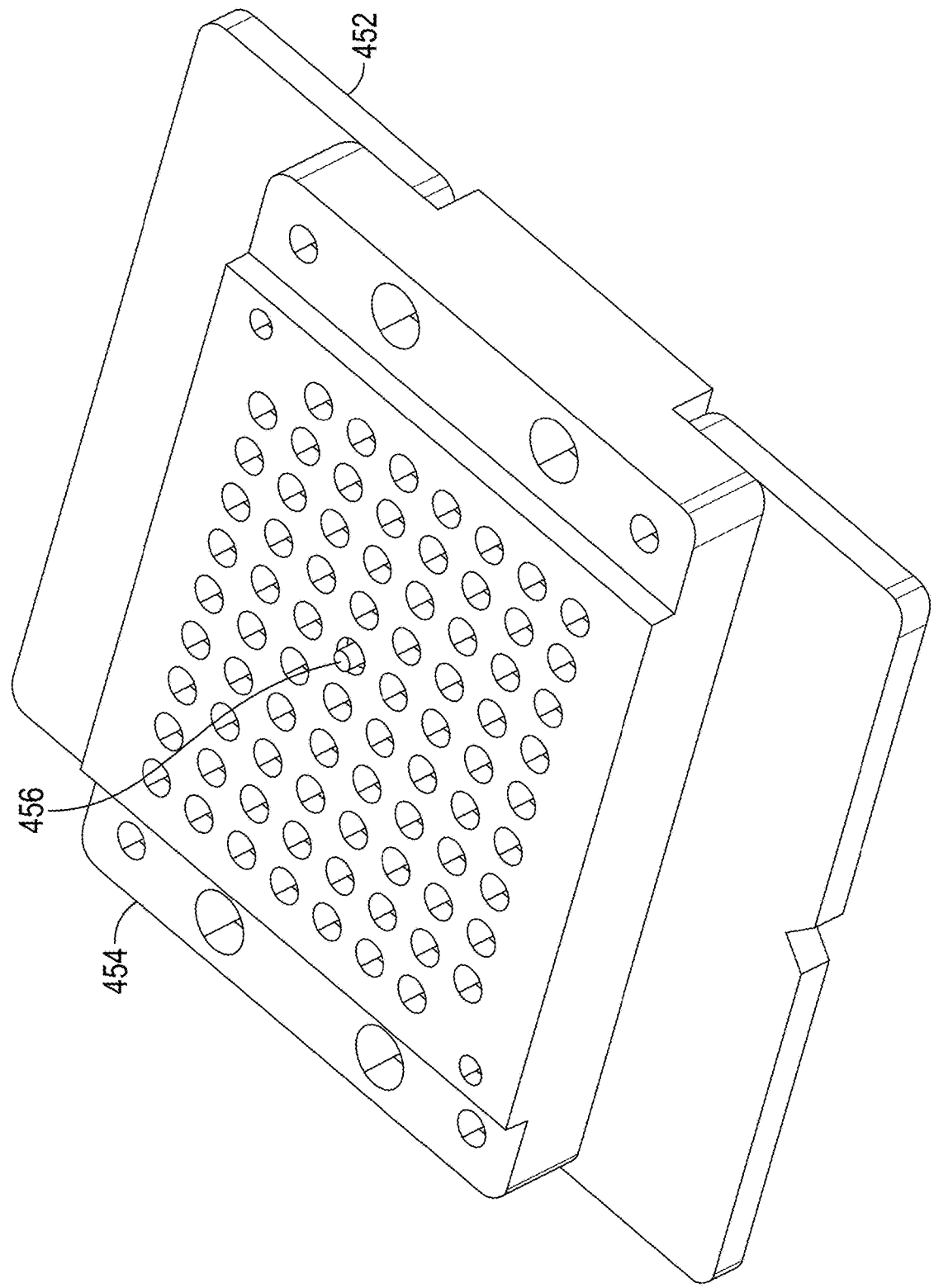
FIG. 13 is a top, front, and side perspective view of one pogo block of an improved functional test head according to an embodiment.

FIG. 13 is a top, front, and side perspective view of one pogo block 454 according to an embodiment. In at least one embodiment, the pogo blocks 454 can be standardized. By way of example, a signal pogo block can have 78 signals that can run at 200 MHz. A power pogo block can carry four signals up to 1000V and 80 A. Standardized pogo blocks can be used to route any instrument signal within the performance range specified by the pogo block. This modularized approach makes adding, removing, and/or reconfiguring tester instruments very easy. These changes can be accommodated without changing any components (other than pogo block itself) in the test head. In one example implementation, pogo blocks (or modules) 454 could have up to 780 signals, allowing a large number of test signals to interface with the DUT.

With reference to FIGS. 14-18, the unique docking mechanism 320 is further explained. Once the electrical signals are brought into the pogo pins 456 of the test head, the signals need to be transferred over to the change kit 400. Change kit 400 may be changed every time a new DUT type comes up for testing. Configuring a functional test head with a new change kit should be an easy process for the test floor operator. The unique change kit design and docking mechanism employed in the improved functional test head disclosed herein makes reconfiguring the test head for a new DUT type very easy.

Figure 14:
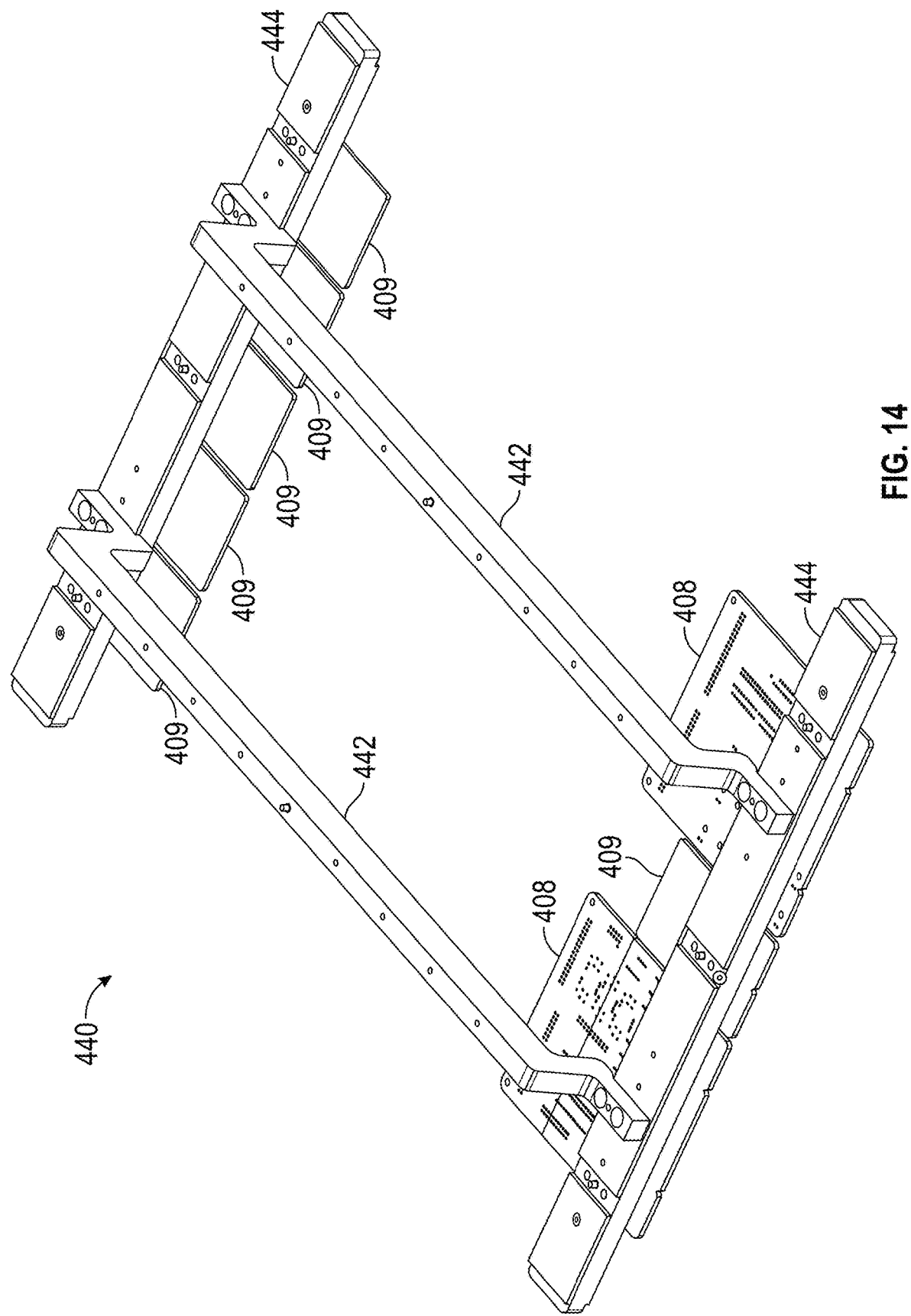
FIG. 14 is another perspective view of a stiffener frame with interface PCBs according to an embodiment.
Figure 15:
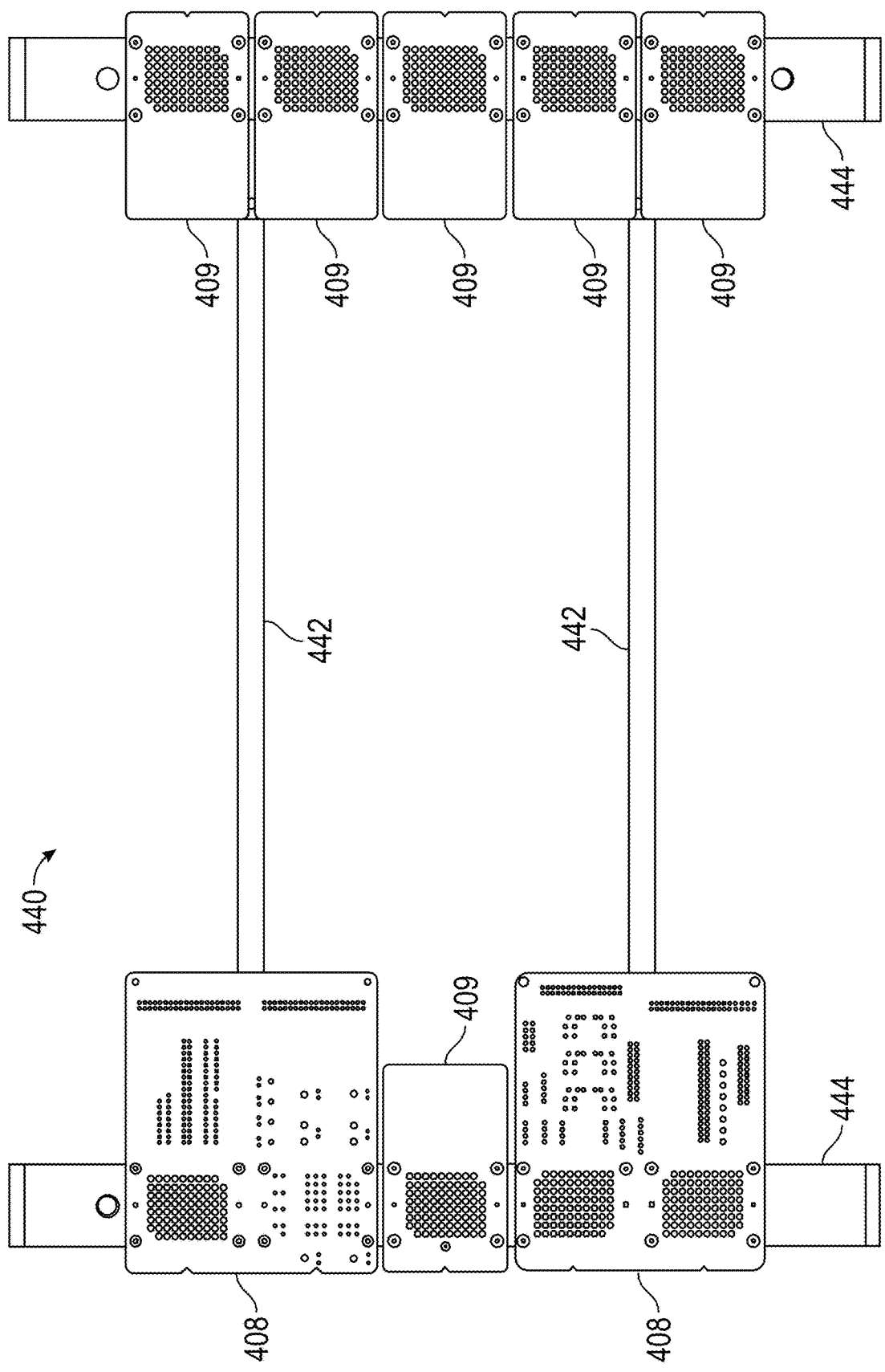
FIG. 15 is a bottom view of a stiffener frame with attached interface PCBs according to an embodiment.

Details of the change kit will now be described to clarify how the functional test head is interfaced with the change kit to transfer electrical signals. The change kit contains an assembly referred to as stiffener frame 440. As shown in FIG. 14, stiffener frame 440 has horizontal bars 444 connected by stiffener cross bars 442 and interface PCBs 408 attached to one of the horizontal bars 444. FIG. 15 is a bottom view of stiffener frame 440, with interface PCBs 408 attached to one of the horizontal bars 444. In this example, one interface PCB 408 is for power signals (e.g., generic test power PCB) and another interface PCB 408 is for communication signals (e.g., generic test communication PCB). In addition, empty slots on the horizontal bars 444 are available for additional DUT-specific interface PCBs 409.

Figure 16:
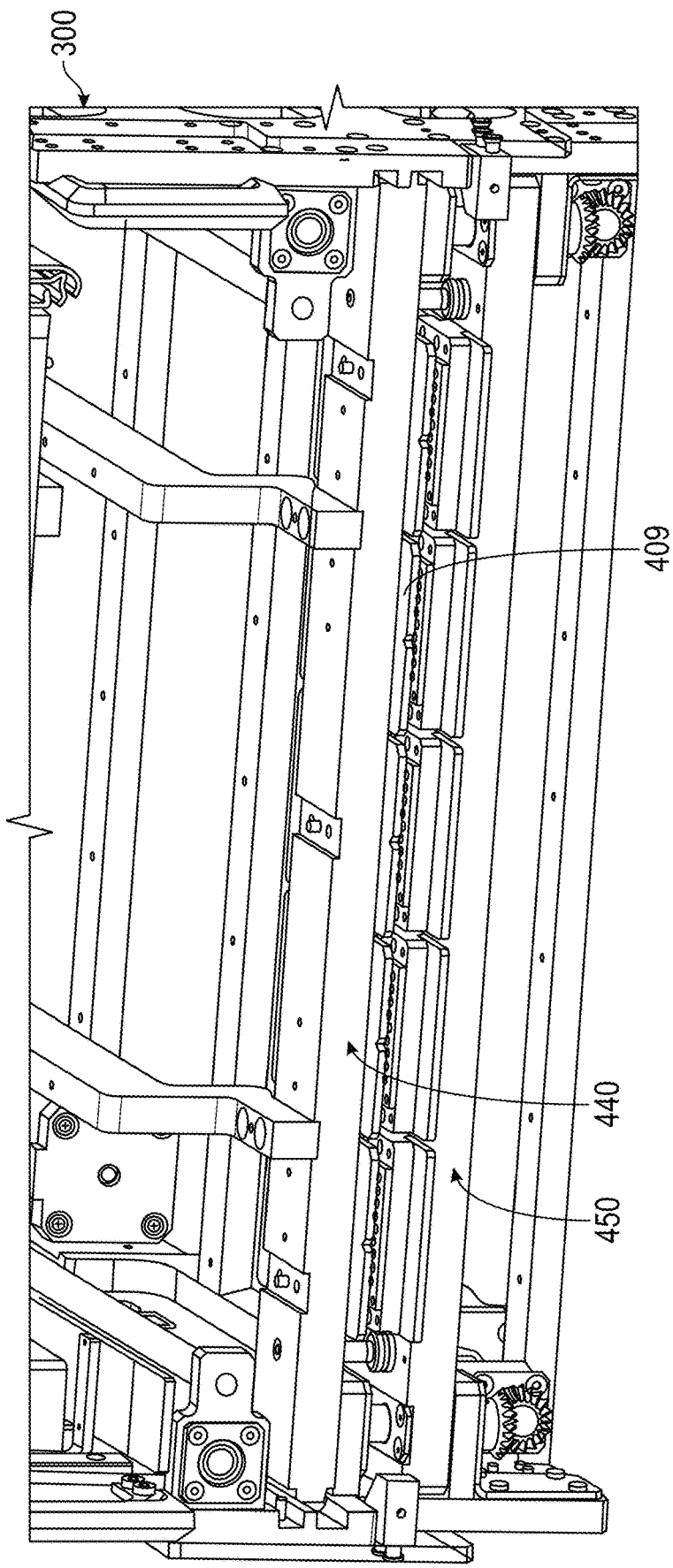
FIG. 16 is a partial view of the test head frame showing a pogo frame, a stiffener frame, and interface PCBs according to an embodiment.

FIG. 16 is a partial perspective view of the test head frame 300 showing the pogo frame 450, stiffener frame 440, and interface PCBs 409. As shown in FIG. 16, inside the test head frame 300, the stiffener frame 440 sits on top of the pogo frame 450. There are alignment mechanisms on each side of the pogo frame that help to align the pogo frame 450 with the stiffener frame 440. The pogo pins inside the pogo blocks (or modules) mounted on the pogo frame 450 align with the electrical pads on the interface PCBs 409. The opposite end of the stiffener frame 440 and the other pogo frame (not shown in FIG. 16) have a similar arrangement and alignment.

The docking process involves pressing the pogo frame 450 against the stiffener frame 440. Docking will force the pogo pins to press against the interface PCB pads and make electrical connection between the test head frame and change kit.

Figure 17:
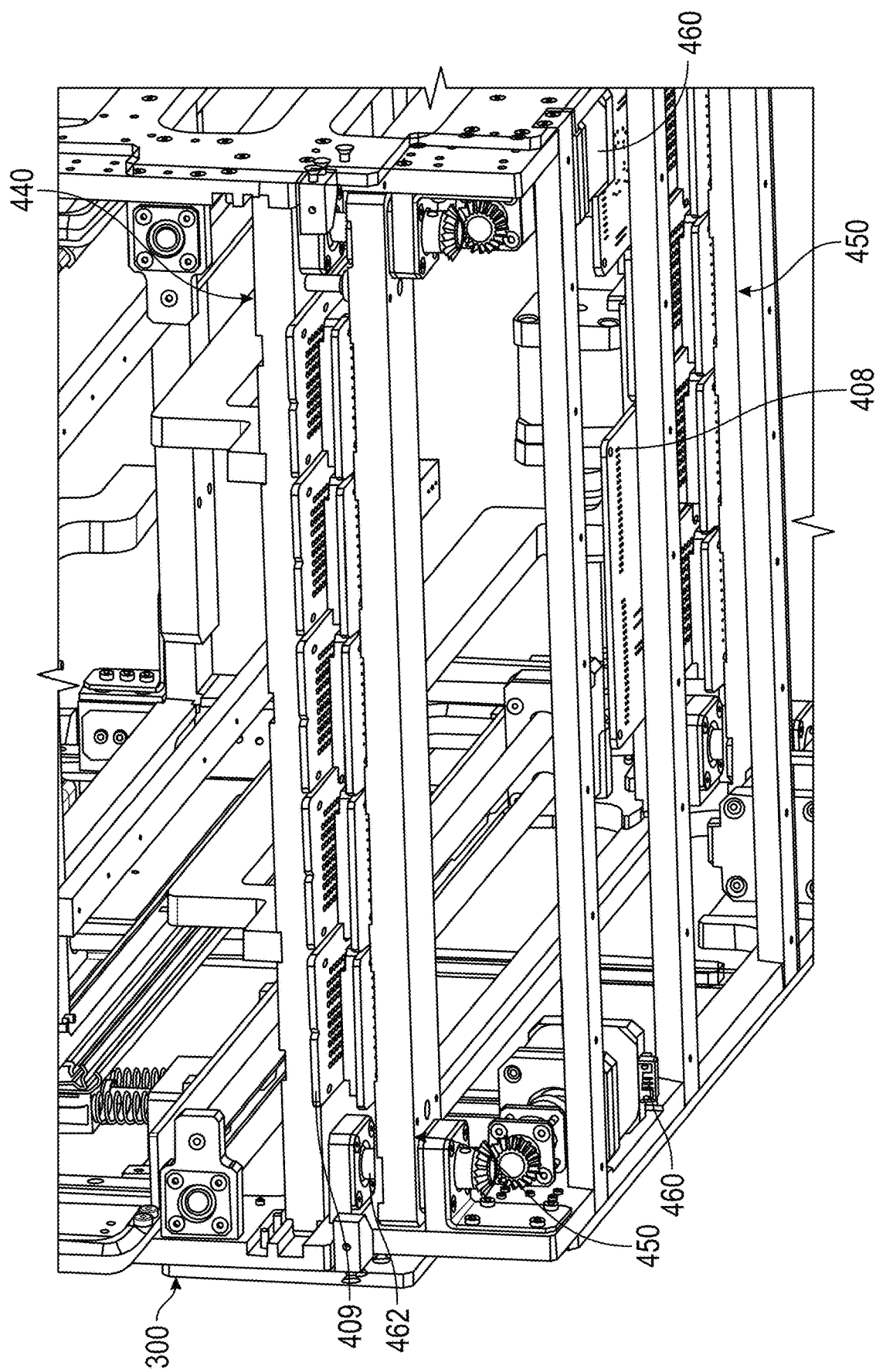
FIG. 17 is a partial bottom, front, and side perspective view of the test head frame showing additional details of an improved functional test head according to an embodiment.

The force required to dock on the side of the pogo frame is generated by the two docking motors placed on the test head at the two ends of each of the pogo frame. One of the docking motors, docking motor 460, is shown in FIG. 17 on the left side lateral wall, and is a partial bottom, front, and side perspective view of the test head frame 300 showing the pogo frames 450, stiffener frame 440, and interface PCBs 408 and 409. Rotary motion and torque of motor 460 is converted to linear motion and linear force by a docking screw 462. Thus, when the motor 460 is operated, the pogo frames 450 press against the stiffener frame 440 and completes docking. Thus, the pogo frame 450 moves between a docked position and an undocked position. The other docking motor (partially shown in FIG. 17 on the right side lateral wall) can operate similarly. A similar docking mechanism is present at the back of the test head for the pogo frame at the back. Thus, there are a total of 4 docking motors to generate torque and force to dock the pogo frames.

Figure 18:
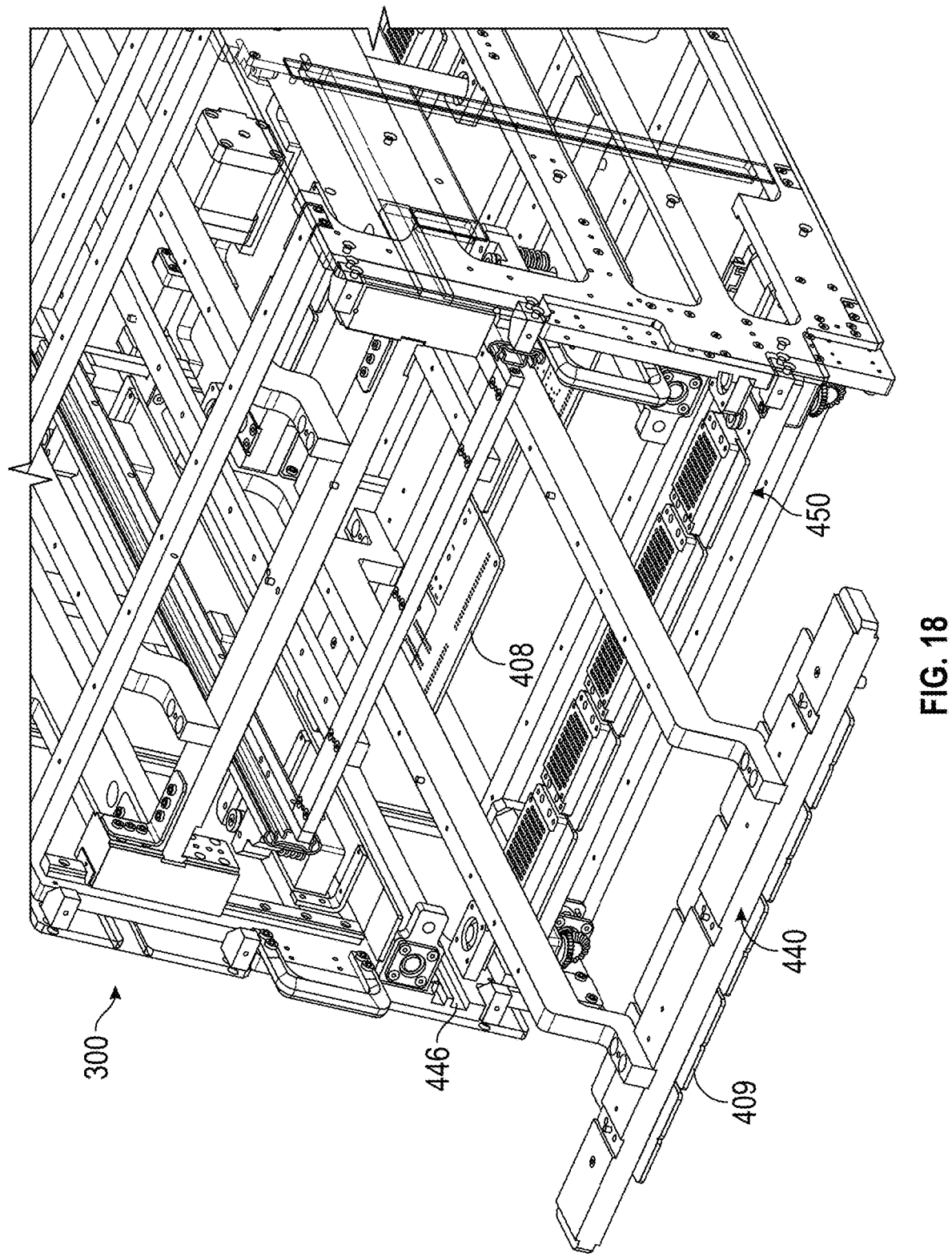
FIG. 18 is a partial front, top, and side perspective view of the test head frame showing a stiffener frame slidably extended from the test head frame according to an embodiment.

Stiffener frame 440 is a part of the change kit 400. When a new DUT type needs to be tested, the stiffener frame 440 can be changed. The test head design allows for quick and easy change of the stiffener frame 440. FIG. 18 illustrates the process of changing the stiffener frame 440. First, the stiffener frame 440 is undocked by operating the docking motors 460. After that, the stiffener frame 440 is slid out of the test head frame 300 by pulling. It slides out on a stiffener track 446 cut on the sides of the test head frame 300.

Figure 19:
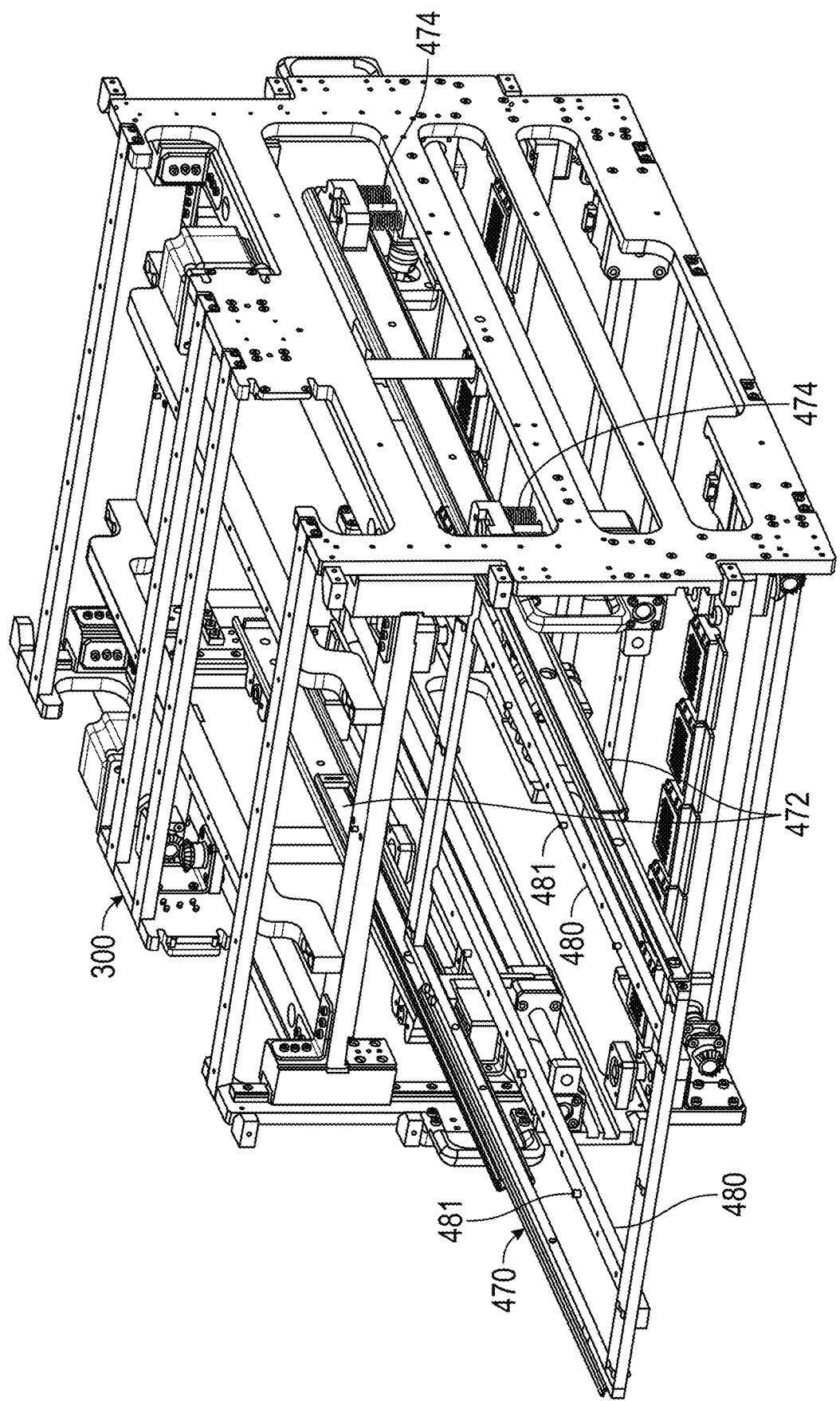
FIG. 19 is a front, top, and side perspective view of the test head frame showing a tray slidably extended from the test head frame according to an embodiment.
Figure 20:
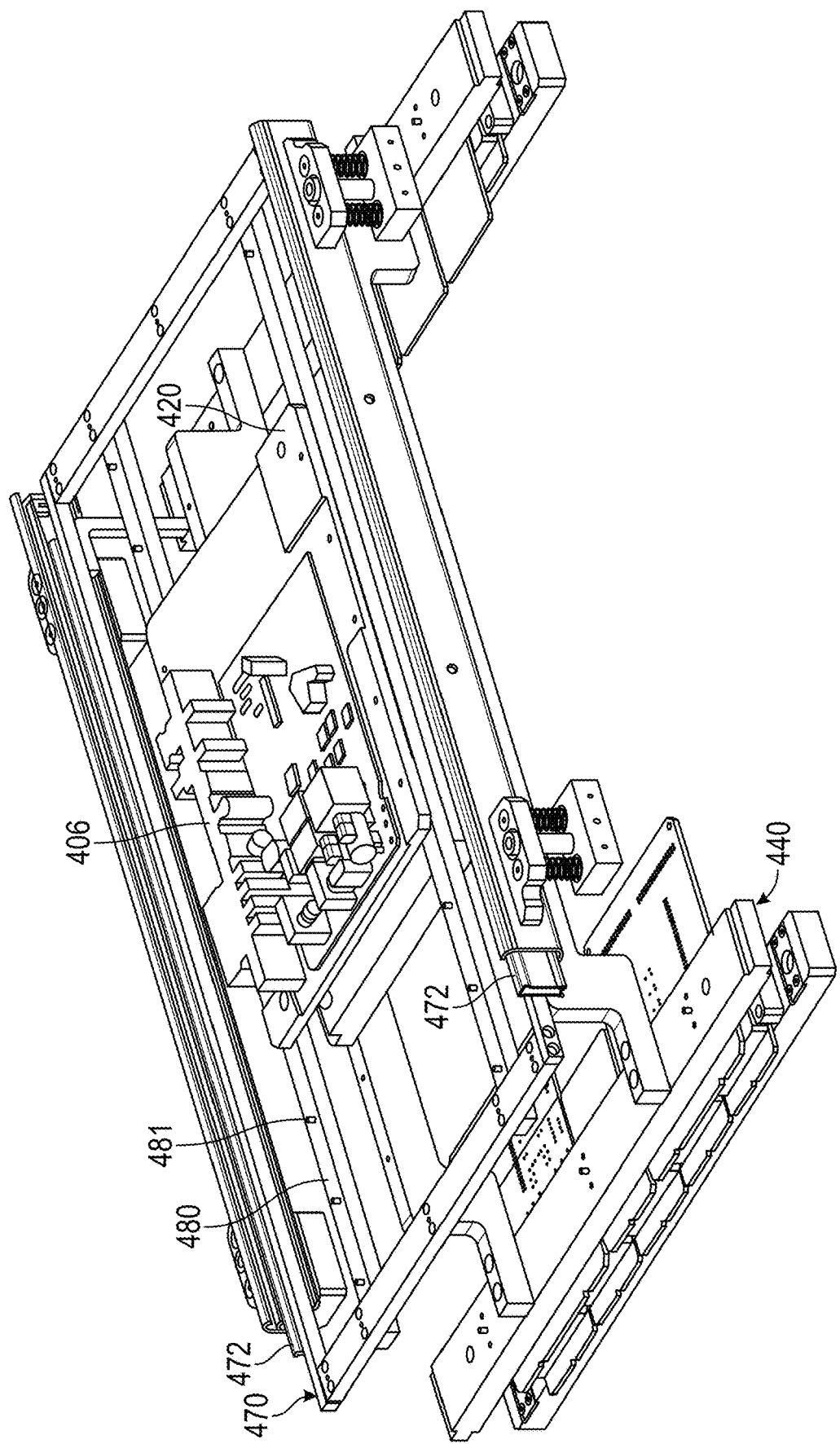
FIG. 20 is a top, side, and front perspective view of a stiffener frame and a DUT tray of an improved functional test head according to an embodiment.

With reference to FIGS. 19-22, the unique DUT handling with a tray 470 and boat/carrier plate 420 is further explained. In current test heads, an operator places a DUT in the change kit and closes the lid of the test head manually to engage the DUT with the change kit. This takes more effort and is more time consuming. The improved functional test head disclosed herein includes tray 470, which slidably extends out of the test head frame 300 on a pair of telescopic rails 472 mounted on test head frame 300, as shown in FIG. 19. The tray 470 also includes a pair of longitudinal bars 480 having spaced projections 481. FIG. 19 shows an extended or ejected position of the tray 470. An operator or an automated mechanism (such as pick and place robot) can place a DUT and its boat/carrier plate on the tray. As shown in FIG. 19, the boat/carrier plate 420 is placed on longitudinal bars 480. The boat/carrier plate 420 is removably attached to the tray 470. Then the tray is slidably moved back inside the test head frame 300 to a retracted position. The DUT 406 and boat/carrier plate 420 placed on the longitudinal bars 480 of the DUT tray 470 are shown in FIG. 20. Once the tray 470 is slidably moved back inside the test head frame 300, the press down mechanism presses down on the DUT. After testing is complete, the tray is ejected again and an operator or an automated mechanism can remove the tested DUT and place a new DUT on the tray 470.

This process has several advantages. First, all testing happens inside the test head frame 300 and inside the 19" rack. So, danger of electrical shock from the test head can be effectively eliminated, significantly increasing safety and preventing accidents. Second, an automation mechanism could be easily built around the test head to run the entire testing process automatically. The functional test head has the electrical commands and interfaces to do fully factory automation and sequencing. Third, the process of placing and removing the DUT does not require any extra force compared to that of a lid closing based approach used in other conventional test heads.

During the entire test operation, the DUT 406 is placed in the boat/carrier plate 420. The DUT boat/carrier plate may be specific to a type of DUT and hence, it is a part of the change kit 400. The DUT boat/carrier plate 420 is attached to the DUT tray 470 shown in FIGS. 19-20. Tray 470 is mounted on the pair of telescopic rails 472. These telescopic rails 472 in turn are attached to the body of the test head frame 300 using a tray mount mechanism 474. The DUT tray 470 and tray mount mechanism 474 illustrate examples of DUT tray 334 and tray mount mechanism 332, respectively.

Figure 21:
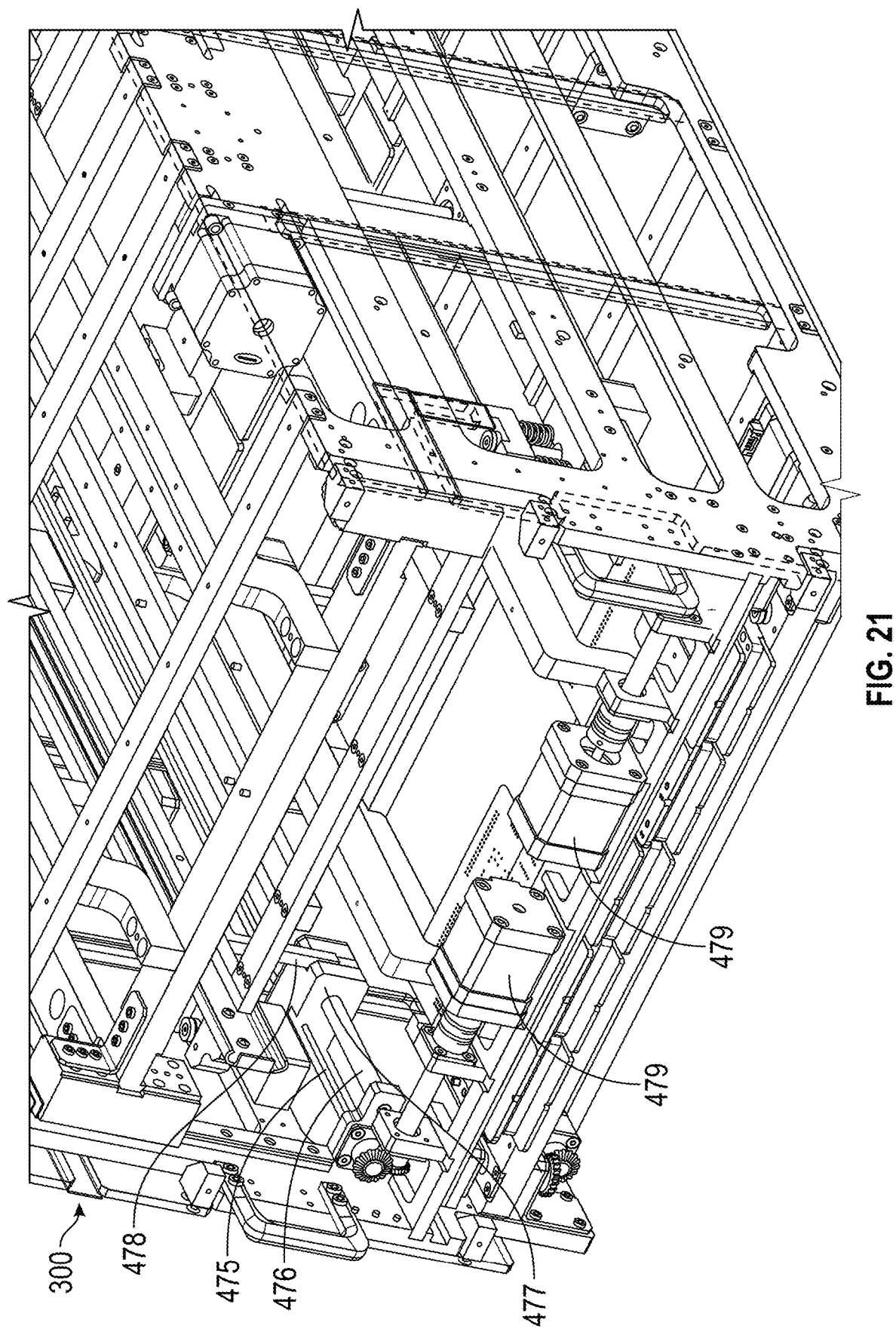
FIG. 21 is a back, side, and top perspective view of a test head frame showing additional details according to an embodiment.

FIG. 21 is a perspective view from the back of the test head frame 300 showing possible details of various components used for ejecting and retracting tray 470. Two tray push motors 479 at the back produce the torque required for tray motion. A tray push lead screw 475 converts the rotary motion and torque of the tray push motors 479 into linear motion and push and pull force. A nut for the lead screw 475 is housed inside a tray push nut mount 477. As the motors 479 rotate, the lead screw 475 turns and the nut mount 477 moves along a tray push track 476 guided by the tray push track. The tray push nut mount 477 is connected to the tray 470 via a tray push rod 478. As the nut moves back and forth based on the direction of the motor rotation, the tray push rod 478 ejects or retracts the tray 470 into and out of the test head frame 300. It should be noted that, in at least one arrangement to accommodate the size of a typical 19" rack, the motors 479 and lead screw 475 are at right angles and transfer of the torque from motors 479 to lead screw 475 is done through two meter gears.

Figure 22:
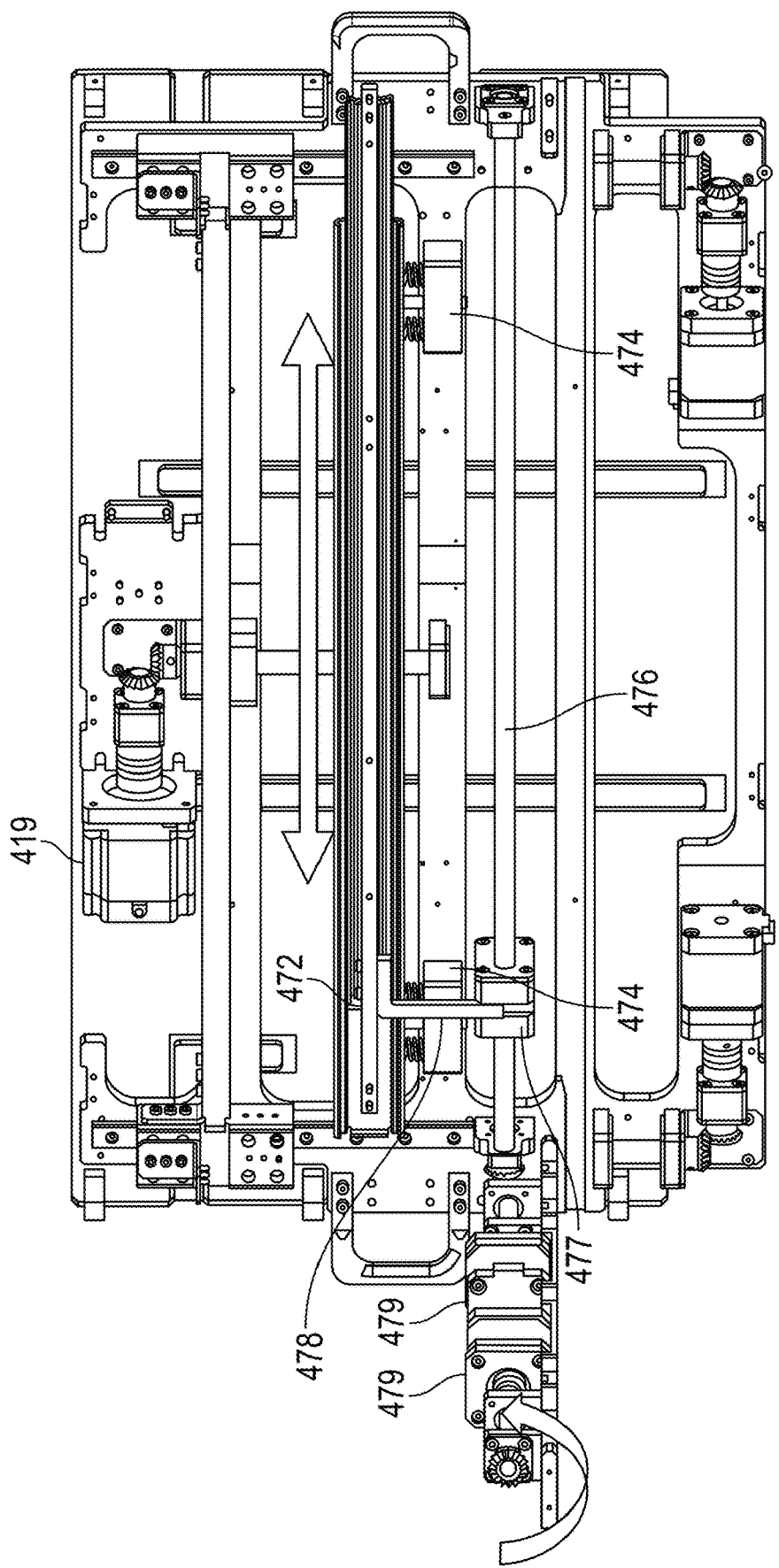
FIG. 22 is an inside side view of the test head frame according to an embodiment.

The operation described above can be more clearly seen by looking inside the test head frame 300, as shown in FIG. 22. FIG. 22 shows various components and the rotary motion of the motors 479 to cause the eject and retract motions of the tray 470.

Figure 23:
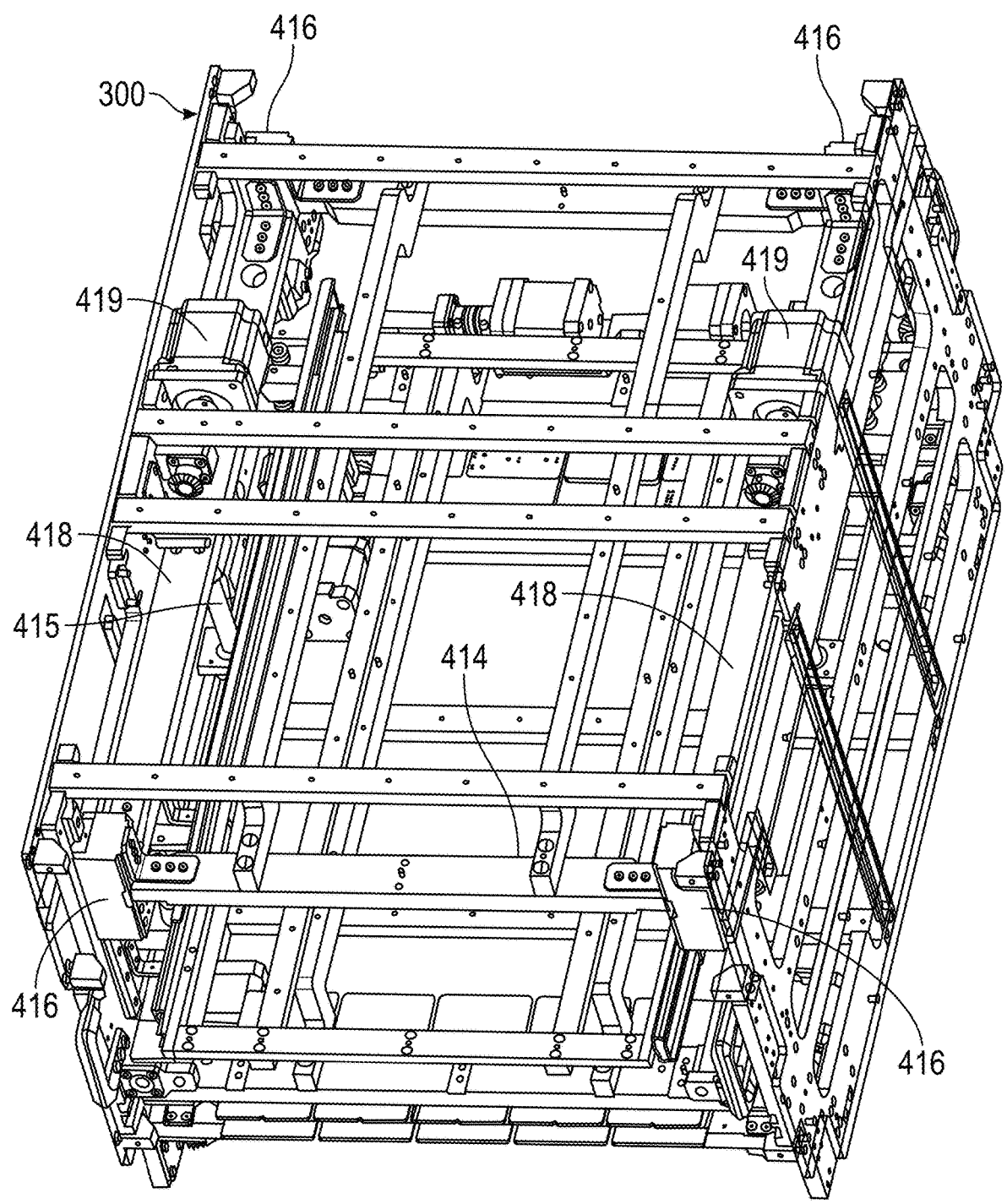
FIG. 23 is a top, front, and side perspective view of a test head frame showing a press down mechanism of an improved functional test head according to an embodiment.
Figure 24:
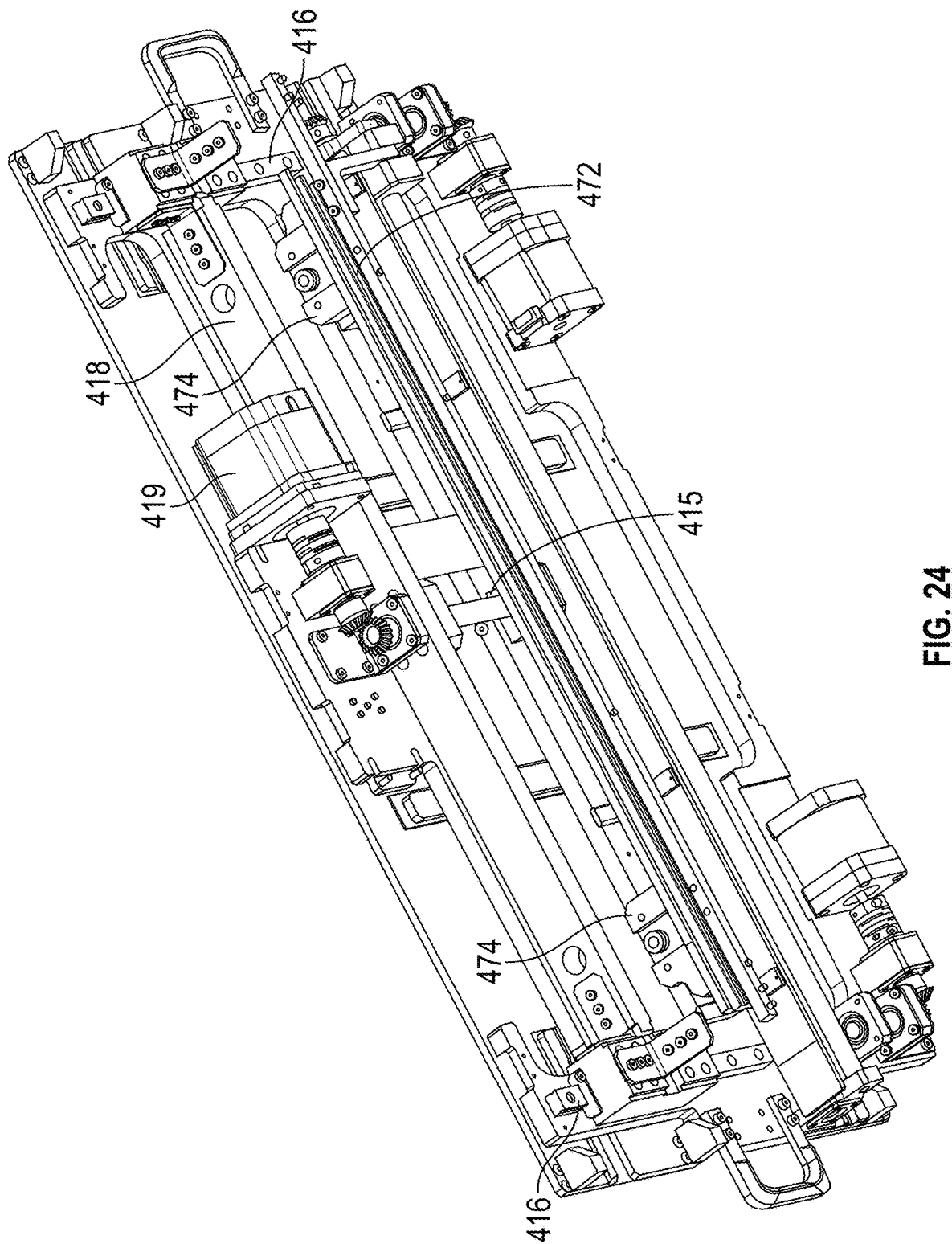
FIG. 24 is an inside side perspective view of a test head frame showing various parts of a press down mechanism of an improved functional test head according to an embodiment.
Figure 25:
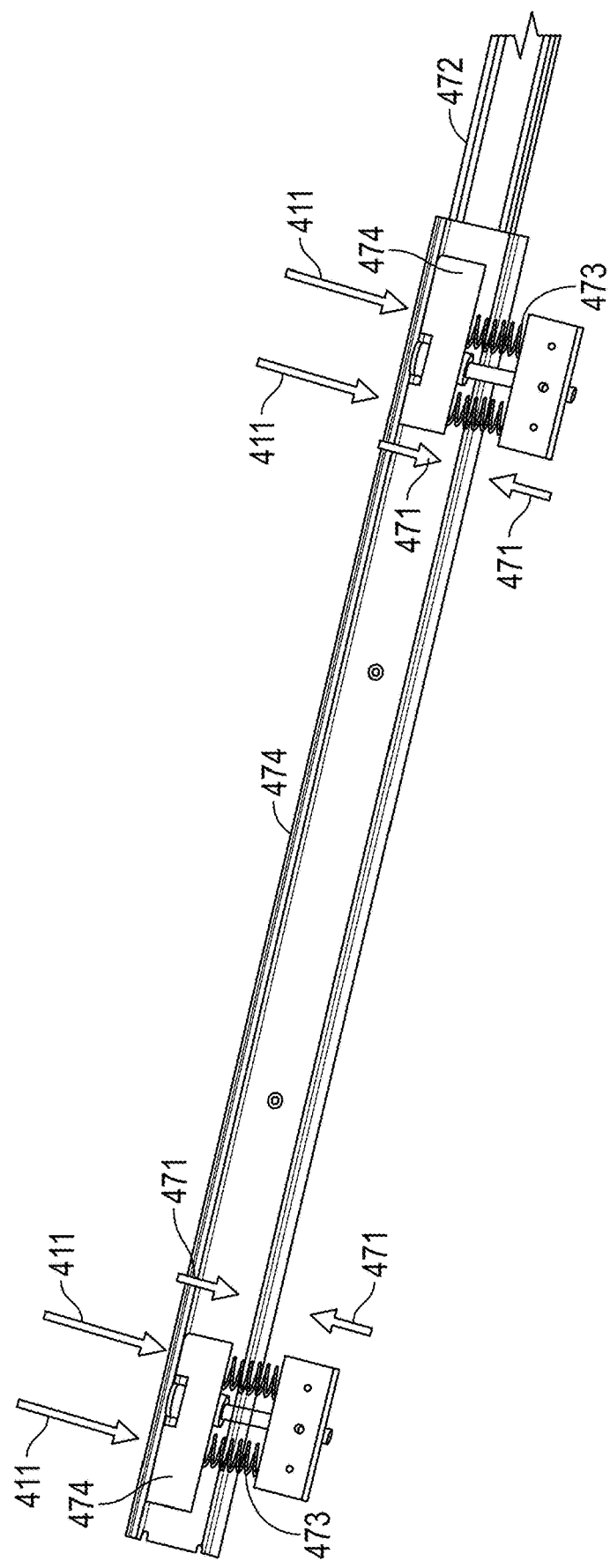
FIG. 25 is a view of a telescopic rail and compression springs according to an embodiment.

With reference to FIGS. 23-25, the DUT press down mechanism 310 is further explained. An important function of the test head frame 300 is to press down on the DUT 406 against the bed of nails (BON) 430 in the change kit 400 to establish electrical connection between the DUT 406 and the change kit 400. Conventionally, this is done by manual press down or press down using pneumatic or electrical actuation. These are done in a test head placed outside a tester rack. Consequently, required safety mechanisms need to be built into conventional test heads.

In embodiments of the improved functional test head 200, the press down action is performed inside the test head frame 300 situated inside a tester rack. This enables high power testing to be performed simply and safely inside the test head frame 300. After the DUT is pressed down, when the press down mechanism retracts, the DUT needs to be pushed back up to the original position to make way for the tray eject and retract motions. Conventionally, this step is achieved manually. In embodiments of the improved functional test head 200, a unique spring-loaded mechanism and spring force pushes the DUT back up once the press down force is removed.

Generally, the DUT press down involves two mechanisms. A first mechanism includes pressing down on the telescopic rails 472 to bring the tray 470 and boat/carrier plate 420 down. When the boat/carrier plate 420 is pressed down, DUT 406 sitting on top of the boat/carrier plate 420 also moves down. A second mechanism includes preventing the DUT from moving up when the DUT touches the pogo pins 432 in the BON 430. The spring force from BON pogo pins 432 pushes DUT 406 up. Press plate 410 fixed on to a press down frame 414 contacts DUT 406 on top and prevents the DUT from moving upward.

Details of various components of the press down mechanism 310 are shown in FIGS. 23-25. Two press down motors 419 on respective sides of test head frame 300 generate the torque needed for press down. A press down lead screw 415 converts the torque and rotary motion of the motor shaft into linear force and linear motion of the press down mechanism. Depending on the direction of the motor rotation the press down mechanism moves up or down. Two press down cross bars 418 on either side of test head frame 300 each house a nut that transfers the force from lead screw 415 to the press down frame 414. The press down frame 414 moves up and down along four linear motion tracks 416 mounted on sides in the front and rear of the test head frame 300.

An inside view of the left side of the test head frame 300, shown in FIG. 24 shows various parts associated with the press down mechanism and further illustrates how the first mechanism of pressing down on telescopic rails 472 works. FIG. 24 shows the telescopic rail 472 on which the tray 470 is mounted. The telescopic rails 472 themselves are mounted on a spring-loaded tray mount mechanism 474. As the motors 419 turn the press down cross bar 418 moves down from a first cross bar position. The press down cross bar 418 is aligned with the tray mount mechanism 474. Once the press down cross bar 418 touches the tray mount mechanism 474 at a second cross bar position, any further downward movement to a third cross bar position will compress the spring on which the tray mount mechanism 474 floats. The force from the press down cross bar 418 compresses the spring and the telescopic rails 472 move downward carrying the tray, the boat/carrier plate, and the DUT along with it from a first tray position to a second tray position.

FIG. 25 illustrates one of the two tray mount mechanisms 474. As shown in FIG. 25, a tray mount mechanism 474 floats on top springs 473 and the compression of the springs and movement of the telescopic rail 472 on the spring-loaded tray mount mechanism 474 is further demonstrated. As shown in FIG. 25 by directional arrows 411, the press down cross bar 418 presses on the tray mount mechanism 474 and the springs 473 get compressed, as shown by directional arrows 471. When testing is complete, the press down motors 419 rotate in the opposite direction and the press down cross bar 418 moves up from the third cross bar position to the second cross bar position and then to the first cross bar position. As the press down cross bar 418 moves up, the springs 473 are released and the springs' forces will push the telescopic rail 472, the tray 470, and the boat/carrier plate 420 and DUT 406 upwards from the second tray position to the first tray position.

Figure 26A:
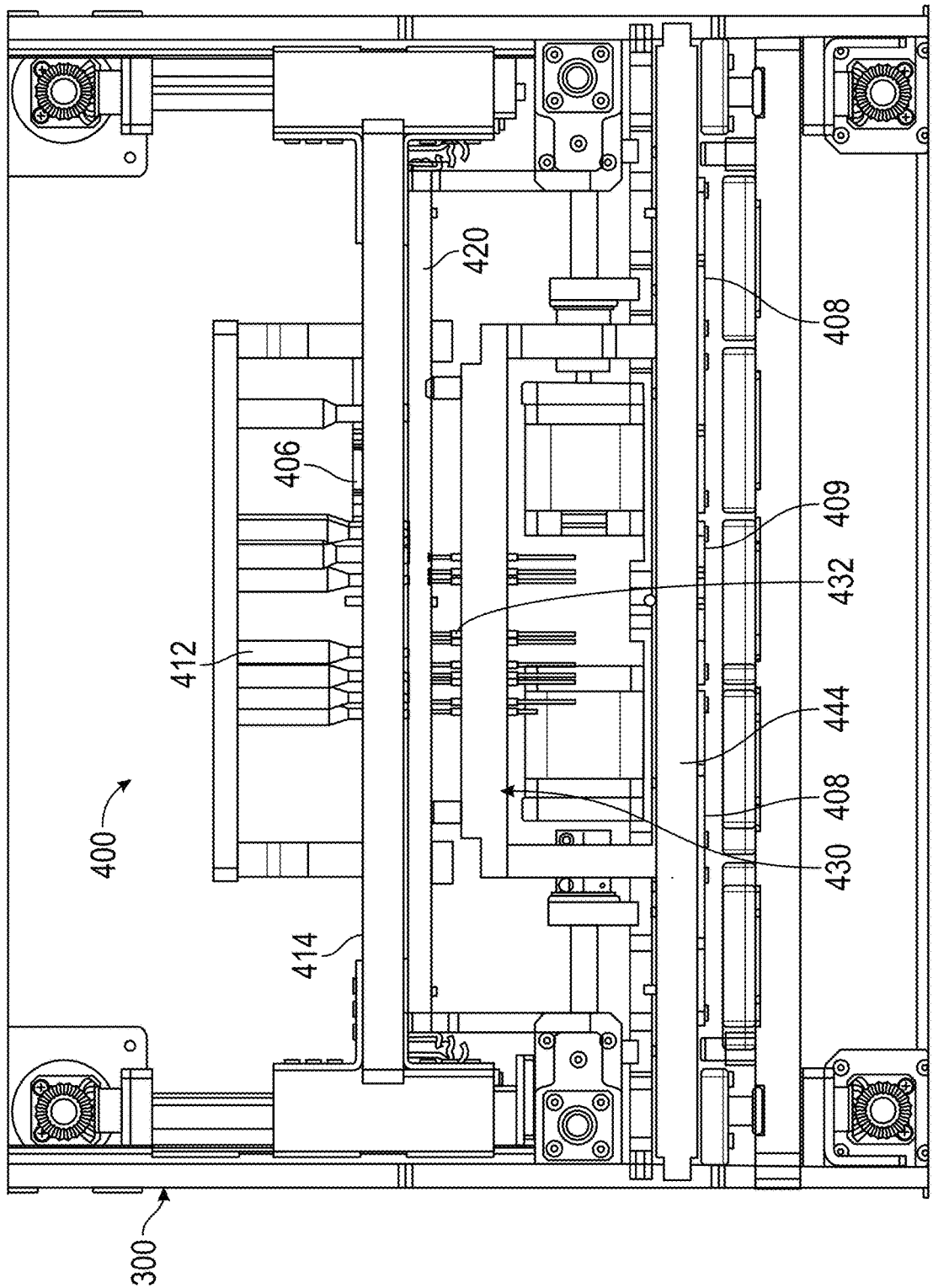

FIGS. 26A and 26B are conceptual diagrams of an improved functional test head illustrating how the press down motion results in establishing electrical connection between DUT 406 and the bed of nails 430. Generally, FIGS. 26A and 26B provide a view of the interior of a functional test head (with a test head frame 300, a change kit 400, and a DUT 406) toward the rear of the test head frame. The primary goal of the press down mechanism is to establish electrical connection between the DUT 406 and the BON 430. First, the press down mechanism presses the press down frame 414 down. Press plate 410 is mounted on the press down frame 414 as shown. Press down frame 414 is also shown, for example, in FIG. 23. Press down frame 414 moves down freely until the press plate 410 touches the top of the DUT 406. When the press plate 410 touches the top of the DUT 406, the press down cross bars 418 compress the tray mount mechanism 474, and the tray 470, boat/carrier plate 420, and DUT 406 start moving down along with the press plate 410. The DUT bottom surface touches down on the pogo pins 432 in the BON 430. Pogo pins 432 start compressing and exerting upward force on the DUT 406. However, DUT 406 will not move up as the press plate 410 is constraining it from the top. Thus, the compressed BON pogo pins 432 press down against the pads at the bottom of the DUT-specific interface PCBs 409 and the other interface PCBs 408 attached to one of the horizontal bars 444 of the stiffener frame 440, and establish electrical connection. It should be apparent that an electrical connection is also established via additional interface PCBs attached to the opposite horizontal bar 444 of the stiffener frame 440, which are not visible in FIGS. 26A and 26B.

Figure 28:
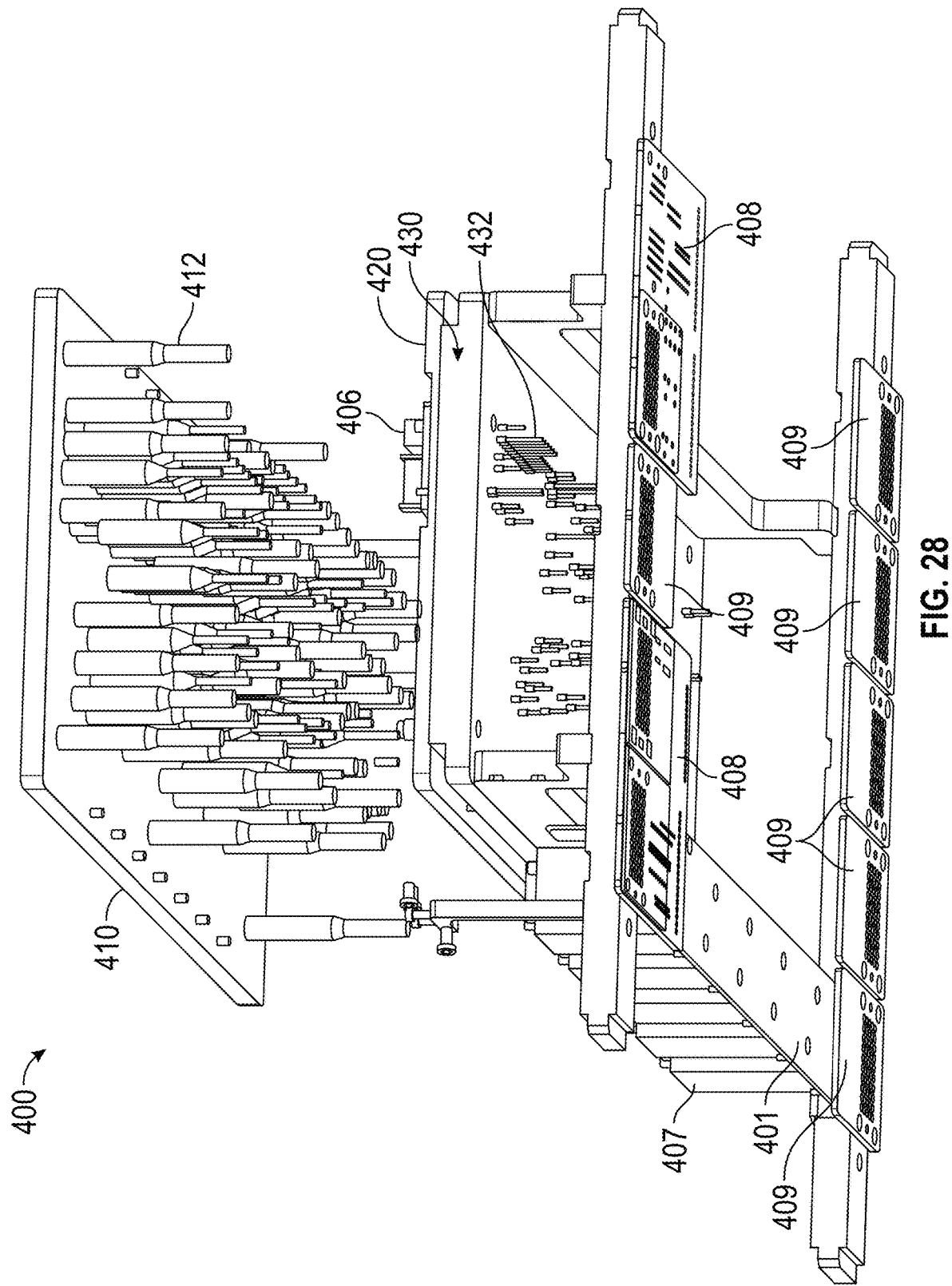
FIG. 28 is another exploded perspective view of a change kit of an improved functional test head according to an embodiment.

FIGS. 27 and 28 are exploded perspective views of change kit 400 with DUT 406. Change kit 400 is one example of change kit 220 of improved functional test head 200. The stiffener frame 440 is a generic design for all DUT. It allows manufacturing and stocking multiple stiffeners in bulk, thereby reducing cost of manufacturing. A DUT having a width lesser than 175 mm can be accommodated in the inner slot of the stiffener frame 440. A DUT having a width between 175 mm to 300 mm can be accommodated within the outer slots of the stiffener frame 440. This feature prevents redesign of stiffener frame 440 for varying dimensions of DUTs. As shown in FIG. 27 non-PCB modules may be connected to the DUT 406 in some implementations. The non-PCB modules may be mounted to a custom frame 401 extending between the horizontal bars 444 of the stiffener frame 440. The custom frame 401 has opposite ends, each of which connects to one of the horizontal bars 444 of the stiffener frame 440. Also, as shown in FIG. 27 by the dashed line, an area 403 is defined between the lower surface of the bed of nails 430 and the interface PCBs 408 and 409. The area 403 is defined to provide space for wiring the interface PCBs 408 and 409 to the pogo pins 432 in the bed of nails 430. The interface PCBs 408 and 409 provide electrical connections to the tester equipment.

The bed of nails 430, boat/carrier plate 420, and press plate 410 may be custom designed to accommodate a specific DUT. They are aligned to the test head frame 300 and stiffener frame 440 via simple 3 mm dowels and secured by mechanical screws. Due to the unique design approach, a single bed of nails 430, boat/carrier plate 420, and press plate 410 will accommodate multisite configuration. So, while going to multisite configuration, the cost of the change kit will not scale with the number of sites linearly.

Figure 29:
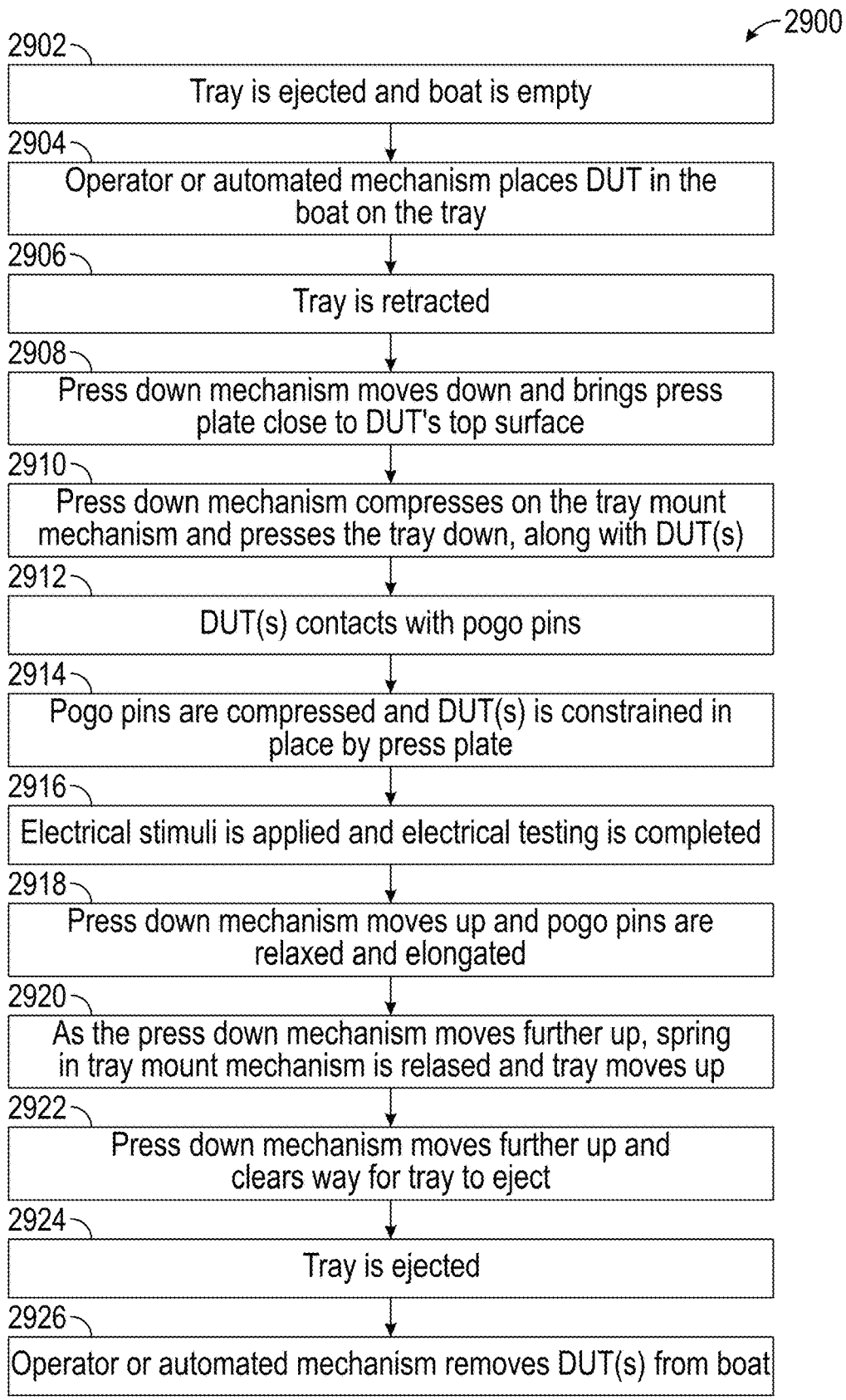
FIG. 29 is a flow diagram of possible operations that may occur in a process for testing a DUT with an improved functional test head according to an embodiment.

FIG. 29 is a flow diagram of possible operations that may occur in a process for testing a DUT with an improved functional test head according to an embodiment. Any one or more of the embodiments of an improved functional test head as disclosed herein, may be used in process 2900.

At 2902, a tray (e.g., 470) is ejected and a boat/carrier plate (e.g., 420) of an improved functional test head is empty. At 2904, an operator or automated mechanism places a DUT (e.g., 406) in the boat/carrier plate on the extended tray. At 2906, the tray is retracted and the DUT in the boat/carrier plate is positioned within the test head frame (e.g., 300).

At 2908, the press down mechanism (e.g., 310) moves down and brings the press plate (e.g., 410) close to a top surface of the DUT. At 2912, electrical pads on the DUT(s) contact or engage pogo pins (e.g., 432) of the bed of nails (e.g., 430). At 2914, the pogo pins are compressed and the DUT(s) is constrained in place by the press plate.

At 2916, electrical stimuli is applied, and electrical testing is completed.

At 2918, the press down mechanism moves up and the pogo pins get relaxed and elongated. At 2920, as the press down mechanism moves further up, the springs (e.g., 473) in the tray mount mechanism (e.g., 474) relax and the tray moves up.

At 2922, the press down mechanism moves further up and clears the way for the tray to eject. At 2924, the tray is ejected.

At 2926, an operator or automated mechanism removes the DUT(s) from the boat/carrier plate.

Figure 30:
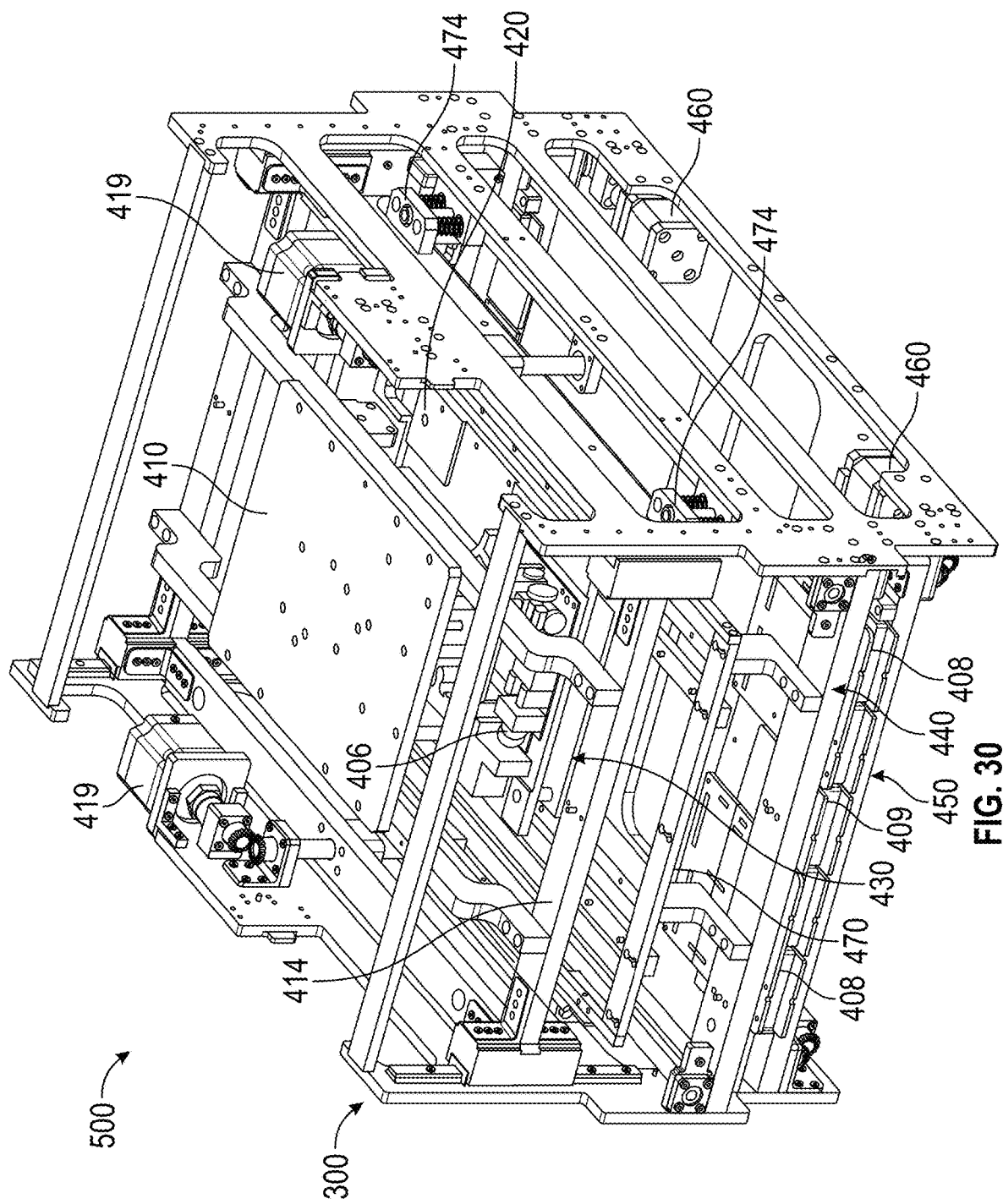
FIG. 30 is a front, top, and side perspective view of an improved functional test head according to an embodiment.

FIG. 30 illustrates a functional test head 500 assembled with test head frame 300 and change kit 400. The DUT 406 is also placed in the boat/carrier plate 420. As previously illustrated herein, test head frame 300 includes a press down mechanism, a docking mechanism, and a DUT tray mechanism. The press down mechanism includes press down motors 419 and press down frame 414, the docking mechanism includes docking motors 460, and the DUT tray mechanism includes a DUT tray 470 and a tray mount mechanism 474. The DUT tray 470 slides inward and outward to enable DUT changes. The change kit 400 includes press plate 410, DUT boat/carrier plate 420 (e.g., specific to the DUT 406 design and size), bed of nails 430, and stiffener frame 440. A device under test, such as DUT 406 configured with a board and components attached to an upper side of the board. The DUT 406 is seated in the boat/carrier plate 420 with a lower side of the board opposing the upper surface of the BON 430. The BON includes a plurality of spring-loaded pogo pins (not visible in FIG. 30) arranged to connect to corresponding electrical pads on the lower side of the DUT 406 when the boat/carrier plate 420 is moved downward. Also, a plurality of interface PCBs 408 and 409 are configured for connection to the plurality of pogo pins on the BON 430. The interface PCBs are also configured to receive test signals from test instruments to excite the DUT 406 so that the DUT can be tested using the test signals.

Figure 31:
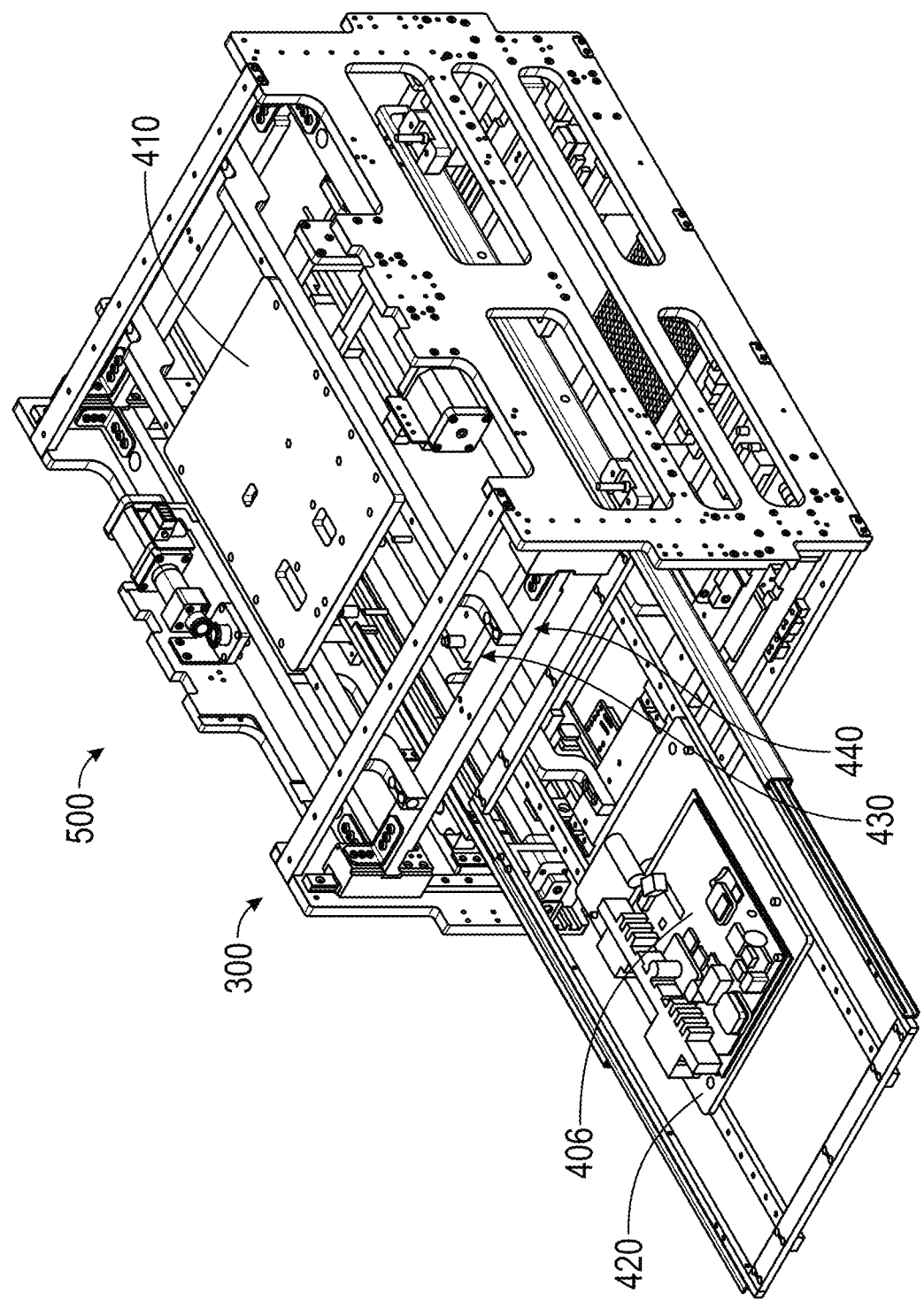
FIG. 31 is a front, top, and side perspective view of an improved functional test head according to an embodiment.

FIG. 31 illustrates the functional test head 500 of FIG. 31 showing the DUT tray 470 in an ejected position (also shown in FIG. 19, for example) where the DUT 406 can be placed in the DUT tray 470 (also shown in FIG. 20, for example). The tray can then be retracted. Once retracted, the press down mechanism and the docking mechanism can be actuated to enable testing of the DUT 406.

Note that in this specification, unless expressly stated to the contrary, use of the phrase 'at least one of' refers to any combination of the named elements, conditions, items, operations, or activities. For example, 'at least one of X, Y, and Z' is intended to mean any of the following: 1) at least one X, but not Y and not Z; 2) at least one Y, but not X and not Z; 3) at least one Z, but not X and not Y; 4) at least one X and at least one Y, but not Z; 5) at least one X and at least one Z, but not Y; 6) at least one Y and at least one Z, but not X; or 7) at least one X, at least one Y, and at least one Z.

Also, references in the specification to "one embodiment," "an embodiment," "some embodiments," etc., indicate that the embodiment(s) described may include a particular feature, structure, element, or characteristic, but every embodiment may or may not necessarily include that particular feature, structure, element, or characteristic. Moreover, such phrases are not necessarily referring to the same embodiment.

Additionally, the designations of 'first', 'second', 'third', etc., are intended to distinguish the particular items (e.g., element, condition, module, activity, operation, claim element, etc.) they modify, but are not intended to indicate any type of order, rank, importance, temporal sequence, or hierarchy of the modified item. Unless expressly stated to the contrary, such designations are arbitrary and have been used for purposes of clarification only. For example, 'first X' and 'second X' are intended to designate two separate X elements that are not necessarily limited by any order, rank, importance, temporal sequence, or hierarchy of the two elements.

In example implementations, at least some portions of the activities outlined herein may be implemented in software. In some embodiments, one or more of these features may be implemented in hardware, provided external to these elements, or consolidated in any appropriate manner to achieve the intended functionality. The various components may include software (or reciprocating software) that can coordinate in order to achieve the operations as outlined herein. In still other embodiments, these elements may include any suitable algorithms, hardware, firmware, software, components, modules, interfaces, or objects that facilitate the operations thereof.

Furthermore, the apparatuses, computing devices, and systems described and shown herein (and/or their associated structures) may also include suitable interfaces for receiving, transmitting, and/or otherwise communicating data or information in a network environment. Additionally, some of the processors and memory elements associated with the various nodes may be removed, or otherwise consolidated such that a single processor and a single memory element are responsible for certain activities. In a general sense, at least some of the arrangements depicted in the FIGURES may be more logical in their representations, whereas a physical architecture may include various permutations, combinations, and/or hybrids of these elements. It is imperative to note that other possible design configurations may be used to achieve the operational objectives outlined here. Accordingly, the associated infrastructure has a myriad of substitute arrangements, design choices, device possibilities, hardware configurations, software implementations, equipment options, etc.

It is also important to note that the operations and steps described with reference to the preceding FIGURES illustrate only some of the possible scenarios that may be executed by, or within, the system. Some of these operations may be deleted or removed where appropriate, or these operations may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Numerous other changes, substitutions, variations, alterations, and modifications may be apparent to one skilled in the art. Accordingly, the present disclosure is intended to encompass all such changes, substitutions, variations, alterations, and modifications as falling within the scope of the appended claims.

Other Notes and Examples

The following examples pertain to embodiments in accordance with this specification. Example A1 provides an apparatus that includes a test head frame; a tray slidably coupled to the test head frame and configured to receive a first device under test (DUT) including a board and components attached to an upper side of the board and the first DUT is positioned within the test head frame when the tray is in a retracted position and the first DUT is positioned outside the test head frame when the tray is in an ejected position; a bed of nails (BON) subassembly opposing a lower side of the board of the first DUT and the bed of nails includes a plurality of pins arranged to connect to corresponding electrical pads on the lower side of the first DUT; and a plurality of interface printed circuit boards (PCBs) configured for connection to a plurality of pogo pins on the BON subassembly and to receive test signals from test instruments to excite the first DUT.

Example A2 comprises the subject matter of Example A1 and the test head frame is sized for placement inside a testing rack.

Example A3 comprises the subject matter of Example A2 and the testing rack is 19 inches in width.

Example A4 comprises the subject matter of Example A1 and further comprises a press plate subassembly adjacent to the components of the DUT and including one or more press pins projecting toward the DUT, and the one or more press pins are arranged to engage the upper side of the PCB of the DUT when the press plate is moved toward the DUT Example A5 comprises the subject matter of Example A4 and when the press plate is moved toward the DUT, the press pins are to engage the upper side of the PCB of the DUT and to prevent upward movement by the DUT, and the pogo pins of the bed of nails subassembly are to engage the corresponding electrical pads on the bottom side of the PCB of the DUT to form a connection between the DUT and the plurality of interface PCBAs.

Example A6 comprises the subject matter of Example A1 and the plurality of pins of the bed of nails subassembly are wire wrapped or soldered to the interface PCBAs.

Example A7 comprises the subject matter of Example A1 and further comprises a carrier plate subassembly removably attached to the tray and positioned between the DUT and the bed of nails subassembly.

Example A8 comprises the subject matter of Example A7 and the bed of nails subassembly, the carrier plate subassembly, and the press plate subassembly are configurable for different types of DUTs.

Example A9 comprises the subject matter of Example A1 and further comprises a stiffener frame subassembly slidably coupled to the test head frame and mechanically attached to the bed of nails subassembly and the plurality of interface PCBAs.

Example A10 comprises the subject matter of Example A9 and the stiffener frame subassembly is mechanically attached to a pogo frame including a plurality of pogo blocks containing tester pogo pins connected to a plurality of tester printed circuit board assemblies.

Example A11 comprises the subject matter of Example A10 and the plurality of interface PCBAs oppose the plurality of pogo blocks and connect to at least some of the plurality of pogo pins in the plurality of pogo blocks for receiving the test signals.

Example A12 comprises the subject matter of Example A1 and further comprises a press plate subassembly opposing the components of the first DUT and including one or more press pins projecting toward the upper side of the board of the first DUT.

Example A13 comprises the subject matter of Example A12 and when the press plate subassembly is moved toward the first DUT, the one or more press pins are arranged to engage the upper side of the board of the first DUT and to prevent movement of the first DUT toward the press plate subassembly.

Example A14 comprises the subject matter of Example A13 and when the press plate is moved toward the DUT, the pogo pins of the BON subassembly are to engage corresponding electrical pads on the lower side of the board of the first DUT.

Example A15 comprises the subject matter of Example A12 and further comprises a carrier plate subassembly positioned between the first DUT and the bed of nails.

Example A16 comprises the subject matter of Example A15 and the carrier plate subassembly, the bed of nails subassembly, and the press plate subassembly are configurable to accommodate a second DUT having a different configuration than the first DUT.

Example A17 comprises the subject matter of Example A1 and further comprises a stiffener subassembly mechanically coupled to the bed of nails and the plurality of interface PCBs.

Example A18 comprises the subject matter of Example A17 and the stiffener subassembly is configurable to accommodate a second DUT having a different configuration than the first DUT.

Example A19 comprises the subject matter of Example A17 and the plurality of interface PCBs oppose a plurality of pogo blocks containing tester pogo pins connected to a plurality of tester printed circuit boards, and the plurality of pogo pins are aligned with and engage electrical pads on the plurality of interface PCBs.

Example A20 comprises the subject matter of Example A1 and at least some of the plurality of interface PCBs are DUT-specific.

Example A21 comprises the subject matter of Example A1 and the pogo pins of the BON subassembly are wire wrapped to the plurality of interface PCBs.

Example M1 provides a method comprising moving a press down mechanism in a test head frame in a first direction causing the press down mechanism to compress on a tray mount mechanism holding a tray with a device under test (DUT) and to cause the tray to move in the first direction, causing a plurality of electrical pads on the DUT to compress a corresponding plurality of pogo pins on a bed of nails, subsequent to applying electrical stimuli to the DUT, moving the press down mechanism in the test head frame in a second direction that is opposite to the first direction, and the moving the press down mechanism in the second direction is to cause a spring in the tray mount mechanism to relax and cause the tray to move in the second direction, and ejecting the tray from the test head frame.

Example M2 comprises the subject matter of Example M1 and further comprises retracting the tray into the test head frame prior to moving the press down mechanism in the first direction, and when the tray is ejected from the test head frame, the DUT is positioned outside the test head frame, and when the tray is retracted, the DUT is positioned within the test head frame.

The invention claimed is:

1. An apparatus comprising:
   a test head frame;
   a tray slidably coupled to the test head frame and configured to receive a first printed circuit board (PCB) to be tested, wherein the first PCB is to be positioned within the test head frame when the tray is in a retracted position and the first PCB is to be positioned outside the test head frame when the tray is in an ejected position;
   a bed of nails opposing a lower side of the first PCB, the bed of nails including a plurality of pins having first portions arranged on an upper side of the bed of nails to connect with corresponding electrical pads on the lower side of the first PCB when the tray containing the first PCB is in the retracted position; and
   a plurality of interface printed circuit boards (PCBs) configured for connection to second portions of the plurality of pins exposed on a lower side of the bed of nails, the plurality of interface PCBs configured to receive test signals from test instruments when the tray containing the first PCB is in the retracted position.

2. The apparatus of claim 1, wherein the test head frame is sized for placement inside a testing rack.

3. The apparatus of claim 2, wherein the testing rack is 19 inches in width.

4. The apparatus of claim 1, further comprising:
   a press plate opposing electronic components provided on an upper side of the first PCB, the press plate vertically movable from a first press plate position in which the press plate is spaced from the first PCB to a second press plate position in which the press plate touches the first PCB.

5. The apparatus of claim 4, wherein the press plate includes press pins projecting toward the first PCB and arranged to engage the upper side of the first PCB when the press plate is in the second press plate position.

6. The apparatus of claim 1, wherein the plurality of pins of the bed of nails are wire wrapped or soldered to the plurality of interface PCBs.

7. The apparatus of claim 1, further comprising:
   a carrier plate removably attached to the tray and positioned between the first PCB and the bed of nails.

8. The apparatus of claim 7, wherein holes are formed in the carrier plate to allow the first portions of the plurality of pins in the bed of nails to pass through to engage the electrical pads on the first PCB.

9. The apparatus of claim 7, wherein the bed of nails, the carrier plate, and a press plate are configurable for different types of PCBs to be tested.

10. The apparatus of claim 1, wherein the pins of the plurality of pins in the bed of nails are spring-loaded.

11. The apparatus of claim 10, further comprising:
    a stiffener frame slidably coupled to the test head frame and mechanically coupled to the bed of nails and the plurality of interface PCBs, wherein the plurality of interface PCBs opposes a plurality of pogo blocks containing a plurality of tester pogo pins connected to a plurality of tester printed circuit boards (PCBs) configured to receive the test signals.

12. The apparatus of claim 1, wherein at least some of the plurality of interface PCBs are specific to the first PCB.

13. A method comprising:
    moving, within a test head frame, a press down mechanism with an attached press plate in a first direction;
    moving, within the test head frame, a tray holding a device under test (DUT) in the first direction in response to the press down mechanism compressing a tray mount mechanism attached to the tray;
    causing a plurality of electrical pads on the DUT to contact first ends of a corresponding plurality of spring-loaded pogo pins on a bed of nails when the tray mount mechanism is compressed, wherein the plurality of spring-loaded pogo pins on the bed of nails are connected to a plurality of interface printed circuit boards (PCBs) within the test head frame; and
    moving, in a second direction toward the plurality of interface PCBs, a pogo frame with a plurality of tester PCBs and a plurality of spring-loaded tester pogo pins to cause the plurality of spring-loaded tester pogo pins to engage electrical pads on the plurality of interface PCBs to form an electrical connection.

14. The method of claim 13, further comprising:
    retracting the tray into the test head frame prior to moving the press down mechanism in the first direction, wherein, when the tray is ejected from the test head frame, the DUT is positioned outside the test head frame, and when the tray is retracted, the DUT is positioned within the test head frame.

15. An apparatus, comprising:
    a test head frame;
    a tray slidably coupled to the test head frame, the tray slidable between an ejected position outside the test head frame and a retracted position inside the test head frame;
    a carrier plate configured to hold a first printed circuit board (PCB) to be tested, the carrier plate removably attached to the tray;
    a stiffener frame slidably attached to the test head frame;
    a bed of nails removably attached to the stiffener frame and including a plurality of spring-loaded pins configured to connect to the first PCB and to a plurality of interface printed circuit boards (PCBs); and
    a press down mechanism coupled to the test head frame, the press down mechanism movable in a first direction to cause, when the tray is in the retracted position, the carrier plate with the first PCB to move in the first direction to engage the plurality of spring-loaded pins in the bed of nails to form an electrical connection.

16. The apparatus of claim 15, further comprising:
    a pogo frame coupled to the test head frame and including a plurality of tester printed circuit boards (PCBs), the pogo frame movable in an upward direction toward the stiffener frame to electrically connect the plurality of tester PCBs to the plurality of interface PCBs.

17. The apparatus of claim 15, wherein the test head frame is sized for placement inside a testing rack.

18. A test head frame comprising:
    a test head body;
    a pair of telescopic rails attached to the test head body;
    a tray coupled to the pair of telescopic rails, the tray slidable via the telescopic rails between an ejected position outside the test head body and a retracted position within the test head body, wherein the tray includes two longitudinal bars with spaced projections to enable removable attachment of a carrier plate configured to hold a first printed circuit board (PCB) to be tested;

a first pogo frame sized to accommodate a first plurality of pogo blocks containing a first plurality of pogo pins connected to a first plurality of pogo printed circuit boards positioned between the first pogo frame and the first plurality of pogo blocks, wherein the first pogo frame is arranged such that the first plurality of pogo blocks opposes a first plurality of interface printed circuit boards (PCBs) attached to a stiffener frame to which a bed of nails is attached when the stiffener frame is removably attached to the test head frame; and a press down mechanism configured to move in a first direction to cause, when the tray is in the retracted position and the carrier plate with the first PCB is attached to the tray, the carrier plate and the first PCB to engage a plurality of spring-loaded pins in the bed of nails to form an electrical connection to the first plurality of interface PCBs.

19. The test head frame of claim 18, wherein the test head frame is sized for placement inside a 19-inch testing rack.

20. The test head frame of claim 18, further comprising:
a docking mechanism including a plurality of docking motors, the docking mechanism configured to move the pogo frame toward the stiffener frame such that the first plurality of pogo pins engage electrical pads on the plurality of interface PCBs.

\* \* \* \* \*